US012635461B2

(12) United States Patent
Jiang et al.

(10) Patent No.: US 12,635,461 B2
(45) Date of Patent: May 19, 2026

(54) LOAD-BEARING DEVICE, WAFER TRANSFER DEVICE, CHAMBER DEVICE AND WAFER PROCESSING APPARATUS

(71) Applicant: Zhongke Jingyuan Electron Limited, Beijing (CN), Beijing (CN)

(72) Inventors: Lei Jiang, Beijing (CN); Tao Mi, Beijing (CN)

(73) Assignee: ZHONGKE JINGYUAN ELECTRON LIMITED, BEIJING (CN), Beijing (CN)

( * ) Notice: Subject to any disclaimer, the term of this patent is extended or adjusted under 35 U.S.C. 154(b) by 476 days.

(21) Appl. No.: 17/822,939

(22) Filed: Aug. 29, 2022

(65) Prior Publication Data

US 2023/0075313 A1 Mar. 9, 2023

(30) Foreign Application Priority Data

Sep. 3, 2021 (CN) .......................... 202111032583.2

(51) Int. Cl.
 *H01L 21/687* (2006.01)
 *H01L 21/67* (2006.01)
 (Continued)

(52) U.S. Cl.
 CPC .. *H01L 21/67742* (2013.01); *H01L 21/67751* (2013.01); *H01L 21/68707* (2013.01);
 (Continued)

(58) Field of Classification Search
 CPC ......... H01L 21/68742; H01L 21/68792; H01L 21/68785; H01L 21/67109; H01L 21/6833;
 (Continued)

(56) References Cited

U.S. PATENT DOCUMENTS 4,360,499 A * 11/1982 Gubitose ................. C30B 15/30
 117/211
5,092,728 A * 3/1992 Crabb ..................... C30B 29/06
 414/217
 (Continued)

FOREIGN PATENT DOCUMENTS

CN 113314447 A 8/2021
JP 2005140185 A 6/2005
JP 2018074174 A 5/2018

OTHER PUBLICATIONS https://ieeexplore.ieee.org/document/7561742 (Year: 2015).*
SIPO, "CN Office Action and Search Report for CN Application No. 202111032583.2", China.

*Primary Examiner* — Mahdi H Nejad
(74) *Attorney, Agent, or Firm* — troutman pepper locke; Tim Tingkang Xia, Esq.

(57) ABSTRACT

The present disclosure provides a load-bearing device telescopic relative to a reference object, a wafer transfer device, a chamber device which is configured to exchange wafers between different pressure environments, and a wafer processing apparatus, the load-bearing device including a base, a movable platform opposite to the base, an ejector rod which is configured to extend through a bearing secured to the base and is coupled to the movable platform, and a driving member which is fixed relative to the reference object and is configured to push against the ejector rod and in turn to drive the ejector rod to displace relative to the base. The bearing device further includes a corrugated tube assembly, surrounding the ejector rod and includes a first corrugated tube sleeved on the ejector rod, the ejector rod and the first corrugated tube cooperating with each other to define collectively a first space.

19 Claims, 13 Drawing Sheets

(51) Int. Cl.
    *H01L 21/677*       (2006.01)
    *H01J 37/32*        (2006.01)

(52) U.S. Cl.
    CPC .. H01L 21/68742 (2013.01); H01L 21/68792
        (2013.01); *H01J 37/32715* (2013.01); *H01L*
            *21/68785* (2013.01)

(58) Field of Classification Search
    CPC .......... H01L 21/6831; H01L 21/67103; H01L
         21/68764; H01J 37/32715; C23C 16/4586
    USPC .......................................... 269/109; 118/728
    See application file for complete search history.

(56) References Cited

U.S. PATENT DOCUMENTS

| | | | | | |
|---|---|---|---|---|---|
| 5,266,119 | A | * | 11/1993 | Taniguchi | H01L 21/67742 |
| | | | | | 118/733 |
| 5,429,498 | A | * | 7/1995 | Okase | H01L 21/67115 |
| | | | | | 432/5 |
| 6,468,353 | B1 | * | 10/2002 | Perlov | H01L 21/68764 |
| | | | | | 414/223.01 |
| 6,932,885 | B1 | * | 8/2005 | Oka | B01J 19/285 |
| | | | | | 156/345.55 |
| 6,935,466 | B2 | * | 8/2005 | Lubomirsky | H01L 21/68742 |
| | | | | | 414/217 |
| 7,516,833 | B2 | * | 4/2009 | Todaka | H01L 21/68721 |
| | | | | | 414/744.1 |
| 8,623,172 | B2 | * | 1/2014 | Hayashi | H01J 37/32568 |
| | | | | | 156/345.47 |
| 10,134,621 | B2 | * | 11/2018 | Caveney | B25J 11/0095 |
| 2001/0052393 | A1 | | 12/2001 | Okabe et al. | |
| 2003/0022498 | A1 | * | 1/2003 | Jeong | H01L 21/67184 |
| | | | | | 438/689 |
| 2010/0163403 | A1 | | 7/2010 | Kitada et al. | |
| 2016/0315000 | A1 | * | 10/2016 | Nguyen | H01L 21/67184 |
| 2017/0152968 | A1 | * | 6/2017 | Raj | H01J 37/32477 |
| 2017/0352565 | A1 | * | 12/2017 | Zhang | C23C 16/4587 |
| 2019/0311925 | A1 | * | 10/2019 | Hong | H01L 21/6838 |
| 2020/0203194 | A1 | * | 6/2020 | Asakawa | H01L 21/68735 |
| 2022/0013383 | A1 | * | 1/2022 | Savandaiah | C23C 14/505 |
| 2022/0293399 | A1 | * | 9/2022 | Mori | H01L 21/68792 |

* cited by examiner

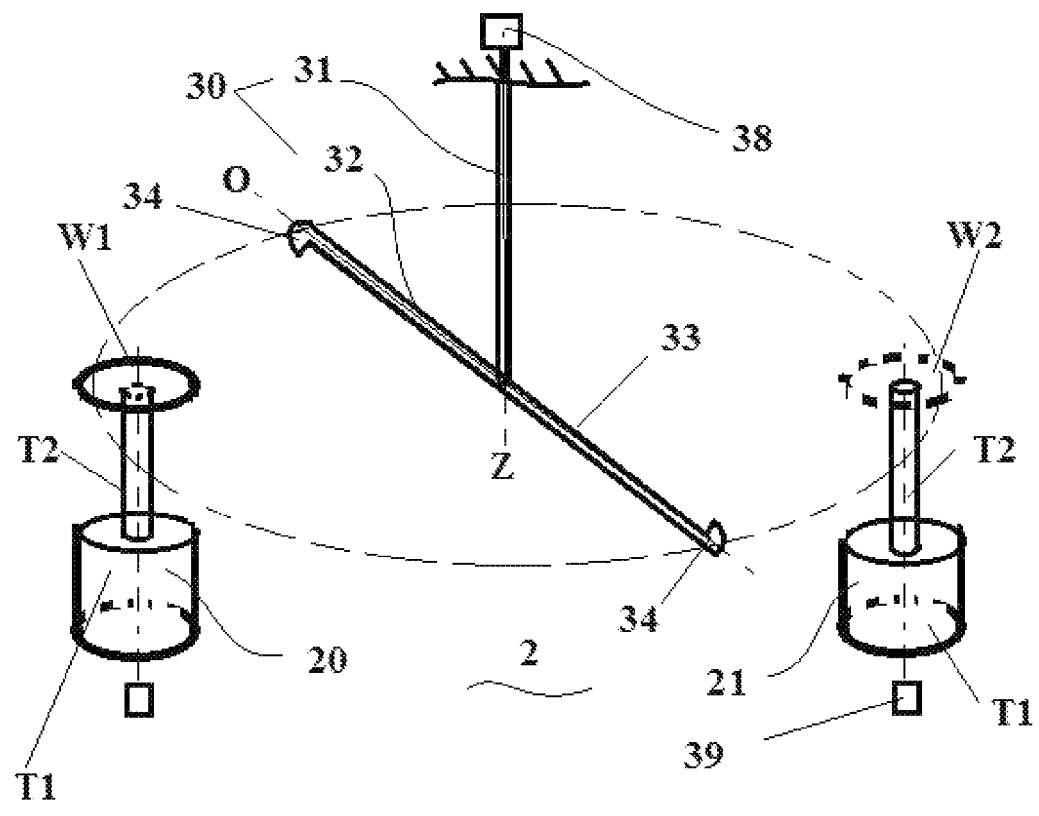
FIG.5A
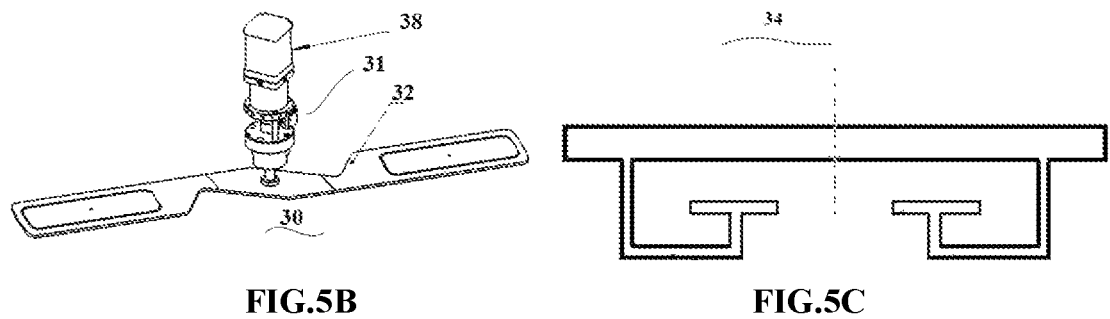
FIG.5B                    FIG.5C

LOAD-BEARING DEVICE, WAFER TRANSFER DEVICE, CHAMBER DEVICE AND WAFER PROCESSING APPARATUS

CROSS-REFERENCE TO RELATED APPLICATION

The embodiments of the present disclosure claims the benefit of Chinese Patent Application Invention No. 202111032583.2 filed on Sep. 3, 2021 in the China National Intellectual Property Administration, the whole disclosure of which is incorporated herein by reference.

BACKGROUND

Field

Embodiments of the present disclosure generally relate to the technical field of semiconductor technology, and more particularly to a load-bearing device which is telescopic (i.e., extendable and retractable) relative to a reference object, a wafer transfer device, a chamber device which is configured to exchange wafers between different pressure environments, and a wafer processing apparatus.

Description of Relevant Art

With a development of semiconductor technology and an advancement of process technology, processes which become increasingly refined rely on a vacuum and dust-free processing environment; then, in the semiconductor processing industry, upon consideration of efficiency and cost, it is urgently required to improve utilization of vacuum and dust-free environment. In the wafer processing apparatus in the art, it is necessary automatically feed and output wafers for implementing a continuous wafer processing and detection, however, a conventional wafer transfer method in the art is a translational wafer-transferring way using a robotic arm; in other words, by way of example, the robotic arm functions as a wafer delivery structure, resulting in that the entire apparatus occupies a relatively large area. In addition, it takes a relatively long time for the robotic arm to transfer wafer, and respective prices of a conventional transfer valve, a vacuum robotic arm, and a vacuum pump are relatively high. As a result, it has led to a relatively large space occupation, a relatively low efficiency, and relatively low economics. Furthermore, valves each disposed between different pressure environments, and respective wafer delivery structures in different pressure environments for wafer delivery, are individually driven, also resulting in complex designs in terms of control. Moreover, if mobile carrier stage for wafers may be multiplexed as a valve between different environments, then, it is necessary to consider relatively large driving force required for raising or lowering the carrier stage due to air pressure difference on both sides of the carrier stage.

Therefore, there is an urgent need for a wafer transfer device with a simple and compact structure and suitable for transferring wafers in a limited space for improving the space occupancy rate, accuracy, efficiency, and mechanical reliability of wafer transfer between different processing environments, simplification of control design, and ease of maintenance.

SUMMARY

The embodiments of the present disclosure have been made to overcome or alleviate at least one aspect of the aforementioned disadvantages and/or shortcomings in the prior art, by providing a load-bearing device which is extendable and retractable relative to a reference object, a wafer transfer device, a chamber device which is configured to exchange wafers between different pressure environments, and a wafer processing apparatus.

Following technical solutions are adopted in exemplary embodiments of the invention.

According to one aspect of the present disclosure, there is provided a load-bearing device, which is telescopic relative to a reference object, comprising: a base; a movable platform, disposed opposite to the base; an ejector rod, which is configured to extend through a bearing secured to the base and is coupled to the movable platform; and a driving member, which is fixed relative to the reference object and is configured to push against the ejector rod and in turn to drive the ejector rod to displace relative to the base. The bearing device further comprises a corrugated tube assembly, which is arranged to surround the ejector rod and comprises a first corrugated tube sleeved on the ejector rod, the ejector rod and the first corrugated tube cooperating with each other to define collectively a first space which communicates to an atmospheric environment through a gap between the ejector rod and the bearing.

According to embodiments of the present disclosure, the corrugated tube assembly further comprises an external tube wrapped outside the first corrugated tube, and wherein the base, the movable platform, the first corrugated tube and the external tube cooperate with one another to define collectively a second space.

According to embodiments of the present disclosure, the second space communicates, through a gas channel formed to penetrate through the base, with a pressure environment at a side of the movable platform facing away from the base.

According to embodiments of the present disclosure, the second space communicates, through a gas channel formed to penetrate through the base, with a gas pressure source whose internal gas pressure is adjustable.

According to embodiments of the present disclosure, the movable platform is provided with a first surface facing towards the base and a second surface facing away from the base, both the first surface and the second surface being planar and perpendicular to an axis of the ejector rod, with an area of a portion of the first surface delimited between the first corrugated tube and the external tube being smaller than an area of the second surface.

According to embodiments of the present disclosure, the area of the second surface is not greater than an area of the first surface.

According to embodiments of the present disclosure, the external tube is an external corrugated tube sleeved over and surrounding the first corrugated tube.

According to embodiments of the present disclosure, the external tube is an extensible elastic sleeve which is axially compressed to a maximum extent in an initial state, with a maximum extension range thereof over which the elastic sleeve is elastically extensible in it axial direction being greater than that of the first corrugated tube.

According to embodiments of the present disclosure, the corrugated tube assembly is made of a metallic material selected from a group consisting of the following: nickel, nickel alloy, stainless steel, titanium, titanium alloy, and a combination thereof.

According to embodiments of the present disclosure, the driving member comprises a prime motor, which comprises one of followings: a linear stepper motor with a trapezoidal lead-screw device, and at least one piezoelectric actuator.

According to embodiments of the present disclosure, the driving member further comprises a displacement-amplifying mechanism, which is coupled between the prime motor and the ejector rod and driven by the prime motor, and is configured to output a displacement amount thereof, which is larger than a displacement amount of the prime motor, at an end thereof connecting with the ejector rod, along a first direction in which the ejector rod extends.

According to embodiments of the present disclosure, the displacement-amplifying mechanism comprises at least one of following: a linkage mechanism, and a leverage mechanism.

According to embodiments of the present disclosure, the linkage mechanism is provided with components symmetrically arranged, whose displacements cancel each other out in opposite directions in a plane orthogonal to the first direction, such that the displacement-amplifying mechanism has its degree of freedom of moving in the first direction at the end being unconstrained and other degrees of freedom thereof at the end being substantially constrained.

According to embodiments of the present disclosure, the linkage mechanism has its components being arranged such that the displacement-amplifying mechanism has its degree of freedom of moving in the first direction at the end being unconstrained and other degrees of freedom thereof at the end being substantially constrained, depending on assembly relationship and dimensional constraints thereof.

According to embodiments of the present disclosure, the prime motor comprises the at least one piezoelectric actuator, and the at least one piezoelectric actuator comprises two piezoelectric actuators arranged in a second direction orthogonal to the first direction. The linkage mechanism comprises: a connecting member, coupled to the ejector rod along the first direction; a crossbar extending in the second direction and connected at a middle portion thereof with the connecting member; and two motion reversing mechanisms which are arranged symmetrically on both sides in a lateral direction of the connecting member and are coupled with the two piezoelectric actuators in transmission relationship therewith in one-to-one correspondence, respectively. Each motion reversing mechanism comprises: a pair of elongated deformable members, symmetrically arranged on both sides of a respective piezoelectric actuator in the first direction and respectively telescopic in the second direction by deforming at respective middle portions, wherein a middle portion of one elongated deformable member in the pair is coupled to the crossbar and a middle portion of the other elongated deformable member in the pair is fixed relative to the reference object; and two connectors, the pair of elongated deformable members being respectively connected at respective proximal ends with respect to the connecting member to one end of the respective piezoelectric actuator via one of the two connectors, and respectively connected at respective distal ends with respect to the connecting member to the other opposite end of the respective piezoelectric actuator via the another one of the two connectors.

According to embodiments of the present disclosure, the prime motor comprises the at least one piezoelectric actuator, the linkage mechanism is constructed in a form of a frame and comprises a fixed portion which is fixed with respect to the reference object and a movable portion which is displaceable in the first direction, as well as a coupling portion provided between the fixed portion and the movable portion, with one end of the at least one piezoelectric actuator being hinged in a pivotable manner to the fixed portion of the frame and the other opposite end of the at least one piezoelectric actuator being attached to the movable portion of the frame, the at least one piezoelectric actuator being provided at an angle between 2° and 45° with respect to a second direction orthogonal to the first direction.

In addition, according to another aspect of the present disclosure, there is provided a wafer transfer device, comprising: the load-bearing device as above, the load-bearing device being arranged to function as a first carrier stage which is liftable vertically by arranging the first direction in a vertical direction; a second carrier stage, which is also liftable vertically; an arm assembly, provided between the first carrier stage and the second carrier stage and comprising: a rotary shaft which is vertically suspended, and a rotary arm, comprising a rod-shaped body which is rotatably mounted at a lower end of the rotary shaft around a vertical axis of the rotary shaft and extends along a longitudinal axis orthogonal to the vertical axis. The rotary shaft further comprises two supporting portions, which are formed respectively at both ends opposite to each other of the body, and are configured to rotate around the vertical axis so as to perform a wafer transfer action from a top of one of the first carrier stage and the second carrier stage to a top of the other of the first carrier stage and the second carrier stage, by a supporting effect applied by the two supporting portions.

According to embodiments of the present disclosure, each supporting portion comprises at least one plate-shaped supporting member perpendicular to the vertical axis, with a minimum distance between respective supporting members of the two supporting portions being larger than a minimum distance between edges of respective top surfaces of the first carrier stage and the second carrier stage, and with a maximum distance between respective supporting members of the two supporting portions being smaller than a maximum distance between the edges of respective top surfaces of the first carrier stage and the second carrier stage, and each supporting member is arranged to be not in contact with each of the first carrier stage and the second carrier stage when the rotary arm rotates around the vertical axis.

According to embodiments of the present disclosure, the wafer transfer device is configured such that: the longitudinal axis is perpendicular to a first plane defined collectively by respective axes of the first carrier stage and the second carrier stage, and respective top surfaces of the first carrier stage and the second carrier stage are flush with each other, in response to a first condition where the rotary arm is rotated to a first position; the longitudinal axis is coplanar with the first plane, and the first carrier stage and the second carrier stage are lowered such that the respective top surfaces of the first carrier stage and the second carrier stage are located lower than respective upper portions of the two supporting portions, in response to a second condition where the rotary arm is rotated to a second position by rotating 90 degrees from the first position; and the longitudinal axis is perpendicular to the first plane defined collectively by respective axes of the first carrier stage and the second carrier stage, and the first carrier stage and the second carrier stage are elevated such that the respective top surfaces of the first carrier stage and the second carrier stage are located higher than respective upper portions of the two supporting portions, in response to a third condition where the rotary arm is rotated to a third position by rotating 180 degrees from the second position.

According to embodiments of the present disclosure, the two supporting portions are of planar construction, respectively, and are constructed to be two curved plate-shaped supporting members extending to two sides of the body opposite to each other, respectively, in a supporting plane perpendicular to the vertical axis, each of the plate-shaped supporting members being provided with an upper surface perpendicular to the vertical axis.

In addition, according to another aspect of the present disclosure, there is provided a chamber device configured to exchange a first wafer and a second wafer between different pressure environments, the chamber device comprising: a first housing, defining an interior vacuum chamber delimited therein as a first pressure environment and defining an outside of the first housing as a second pressure environment, the first housing being further provided with an opening communicating between the first pressure environment and the second pressure environment; and the wafer transfer device as above, which is provided inside the vacuum chamber, with the first carrier stage being arranged to at least partially overlap with the opening. The transfer device further comprises a valve plate, which is co-axially provided on the first carrier stage and is configured to be elevated or lowered with the first carrier stage so as to close or open the opening.

In addition, according to another aspect of the present disclosure, there is provided a wafer processing apparatus, comprising: a first housing, defining an interior vacuum chamber, in which a wafer processing device or a wafer detection device is installed; the wafer transfer device as above; and a second housing, which is disposed adjacent to the first housing and defines a transition chamber. The first housing is formed with an opening communicating to the second housing, and the first carrier stage of the wafer transfer device is arranged to at least partially overlap with the opening; the wafer transfer device further comprises a valve plate, which is co-axially provided on the first carrier stage and is configured to be elevated or lowered with the first carrier stage so as to close or open the opening; the transition chamber communicates with the vacuum chamber via the opening at one side thereof, and also communicates with the atmospheric environment via a second valve at the other side thereof; and the wafer processing apparatus further comprises a robotic arm disposed outside the first housing and configured to move the wafer between the atmospheric environment and the transition chamber.

BRIEF DESCRIPTION OF THE DRAWINGS

Embodiments of the present disclosure will now be described, merely by way of example, with reference to the accompanying schematic drawings, in which the corresponding reference numerals represent the corresponding components. A brief description of the drawings is as follows:

FIG. 5A illustrates a schematic structural view of a wafer transfer device according to embodiments of the disclosure, the wafer transfer device comprising the load-bearing device as shown in FIG. 1B;

FIG. 5B illustrates a schematic structural view of an arm assembly of the wafer transfer device as shown in FIG. 5A;

FIG. 5C illustrates a schematic structural view of an alternative supporting portion of an arm assembly of the wafer transfer device;

DETAILED DESCRIPTION OF EMBODIMENTS

Figure 1A:
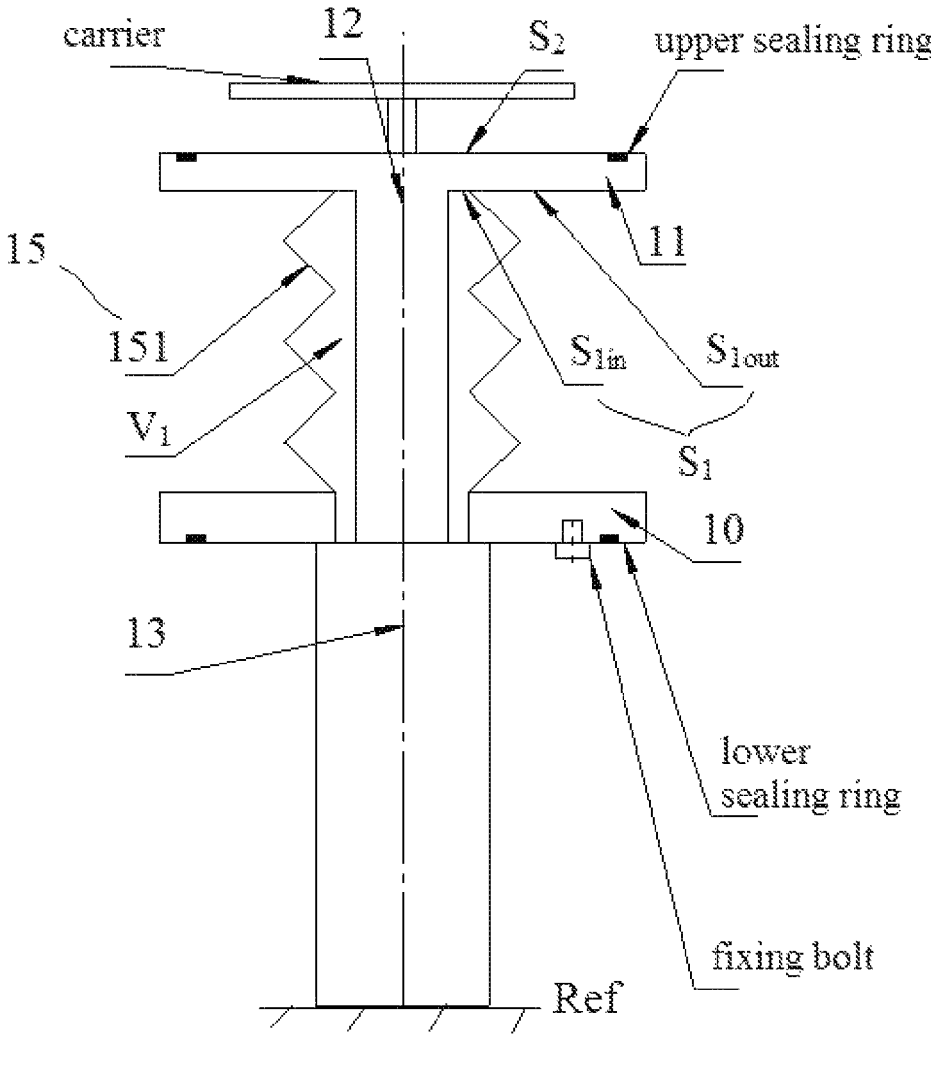
FIG. 1A illustrates a schematic view of a load-bearing device which is extendable and retractable, according to some embodiments of the disclosure.

Technical solution of the present disclosure will be further explained in detail through the embodiments in combination with the accompanying drawings. In the specification, same or similar reference numerals and alphabets indicate same or similar components. Following description of the embodiments of the present disclosure with reference to the accompanying drawings is intended to explain overall inventive concept of the present disclosure, rather than a limitation of the present disclosure.

The accompanying drawings are used to illustrate the contents of embodiments of the present disclosure. Dimensions and shapes of the components in the drawings do not demonstrate true scales of components of a load-bearing device which is telescopic (i.e., extendable and retractable) relative to a reference object, a wafer transfer device, a chamber device which is configured to exchange wafers between different pressure environments, and a wafer processing apparatus.

Above all, an operation principle on which the present disclosure is based, is described.

FIG. 1A illustrates a schematic view of a load-bearing device 1 which is extendable and retractable, according to some embodiments of the disclosure.

In embodiments of the disclosure, on the basis of a general technical concept of embodiments of the disclosure, as illustrated in FIG. 1A, then, in one aspect of embodiments of the present disclosure, a load-bearing device 1 which is telescopic (i.e., extendable and retractable) relative to a reference object labeled as 'Ref' and is for example configured to carry/hold carrier for specific object (e.g., wafer W), is provided, comprising: a base 10; a movable platform 11, disposed opposite to the base 10; an ejector rod 12, which is configured to extend through a bearing 14 secured to the base 10 and is coupled to the movable platform 11; and a driving member 13, which is fixed relative to the reference object Ref and is configured to push against the ejector rod 12 and in turn to drive the ejector rod 12 to displace relative to the base 10. The reference object Ref is for example a ground on which the load-bearing device 1 is installed, and is considered as a fixed reference.

In embodiments of the disclosure, the load-bearing device 1 further comprises a corrugated tube assembly 15 (i.e., which may also be referred to as a bellows assembly 15), which is arranged to surround the ejector rod 12. More specifically, the corrugated tube assembly 15 comprises a first corrugated tube 151 sleeved on the ejector rod 12, and the first corrugated tube 151 is bonded (e.g., bonded by welding) at its lower edge to the base 10 in a sealed manner and bonded (e.g., bonded by welding) at its upper edge to the movable platform 11 in a sealed manner, and thereby the ejector rod 12 and the first corrugated tube 151 cooperate with each other to define collectively a first space V1 which communicates to an atmospheric environment through a gap between the ejector rod 12 and the bearing 14. The corrugated tube allows a frictionless flexion of its own, such that no friction is introduced during a movement of the ejector rod 12 on which the corrugated tube is sleeved, thereby eliminating particle generation due to friction.

As such, with above setting, among others, the first space V1 which is defined collectively by both the corrugated tube assembly 15 and the ejector rod 12 of the load-bearing device 1 and communicates to the atmospheric environment, then, in a condition that the load-bearing device 1 is entirely exposed to a vacuum environment, i.e., in a condition that both an area of a portion of a side of the movable platform 11 facing towards the base 10 (hereinafter referred to as "first surface S1") which portion fails to be exposed to the first space V1, and an entire area of a side of the movable platform 11 facing away from the base 10 (hereinafter referred to as "second surface S2") are in the atmospheric environment, then, an atmospheric pressure is applied to an area labeled as $S_{1in}$ (hereinafter referred to as "internal atmospheric-side area") of a portion of the first surface S1 which portion is exposed to the first space V1; and since an area of a portion of the second surface S2 which portion is corresponding to the internal atmospheric-side area $S_{1in}$ (more specifically, i.e., an area of a projection of the internal atmospheric-side area $S_{1in}$ onto the side of the movable platform 11 facing away from the base 10) is exposed to vacuum, then there is no gas pressure applied thereto (in other words, there is no atmospheric load being applied at the area of the portion of the second surface S2 corresponding to the internal atmospheric-side area $S_{1in}$ so as to resist a driving force directing towards the movable platform from the base 10), such that in addition to the driving force applied onto the first surface S1 of the movable platform 11 by the driving member 13, a pressure of the atmospheric pressure acting onto the internal atmospheric-side area $S_{1in}$ also plays an auxiliary role to assist in driving the movable platform 11, thereby decreasing a magnitude of the driving force required to be applied.

Figure 1B:
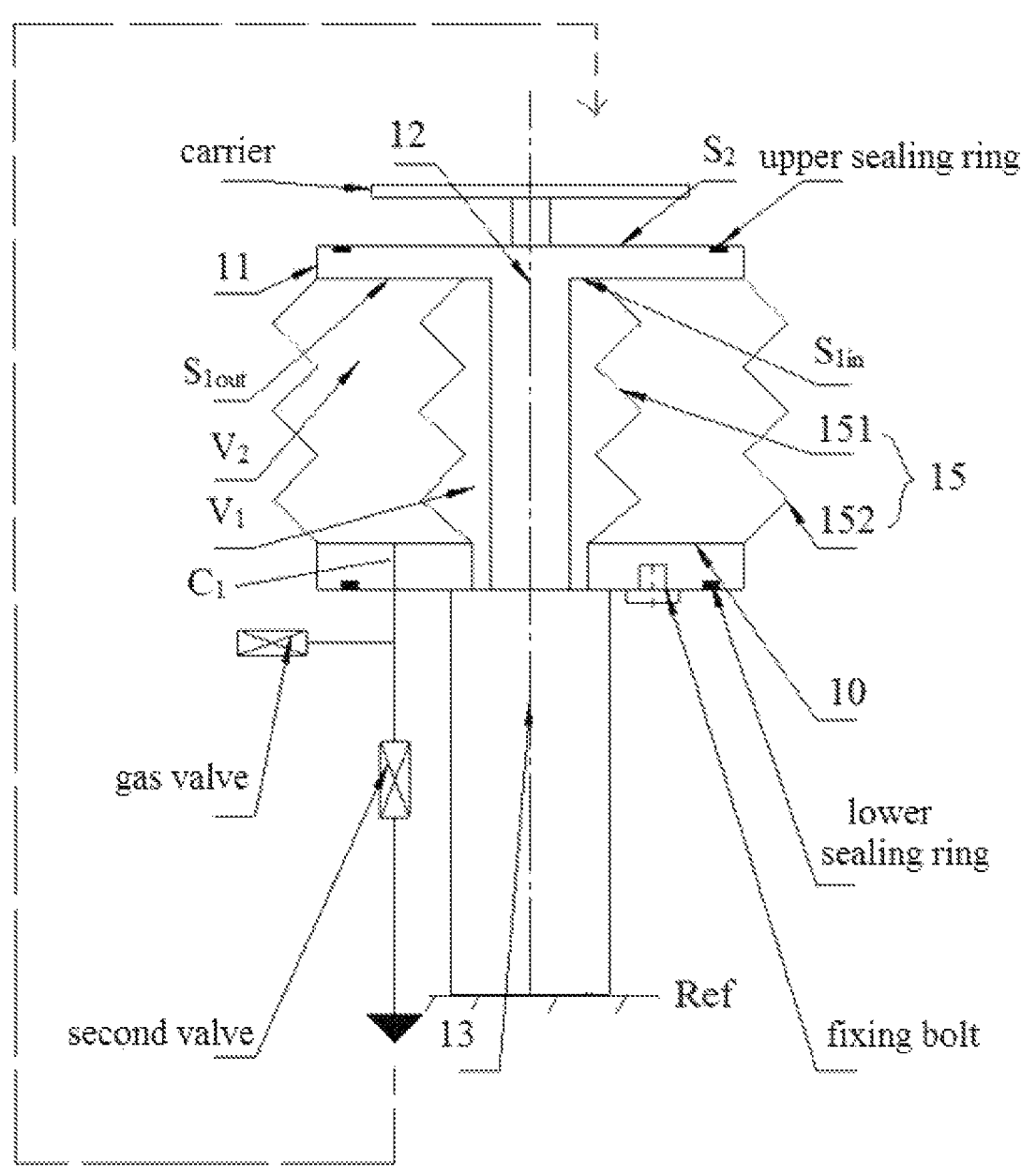
FIG. 1B illustrates a schematic view of another load-bearing device which is extendable and retractable, according to some other embodiments of the disclosure, wherein a second space communicates with the a pressure environment of a movable platform at a side thereof facing away from a base.

FIG. 1B illustrates a schematic view of another load-bearing device 1 which is extendable and retractable, according to some other embodiments of the disclosure, wherein a second space V2 communicates with the a pressure environment of a movable platform 11 at a side thereof facing away from the base 10. And FIG. 1C illustrates a schematic view of another load-bearing device 1 which is extendable and retractable, according to some other embodiments of the disclosure, wherein the second space V2 communicates with a gas pressure source whose internal gas pressure is adjustable.

Figure 1C:
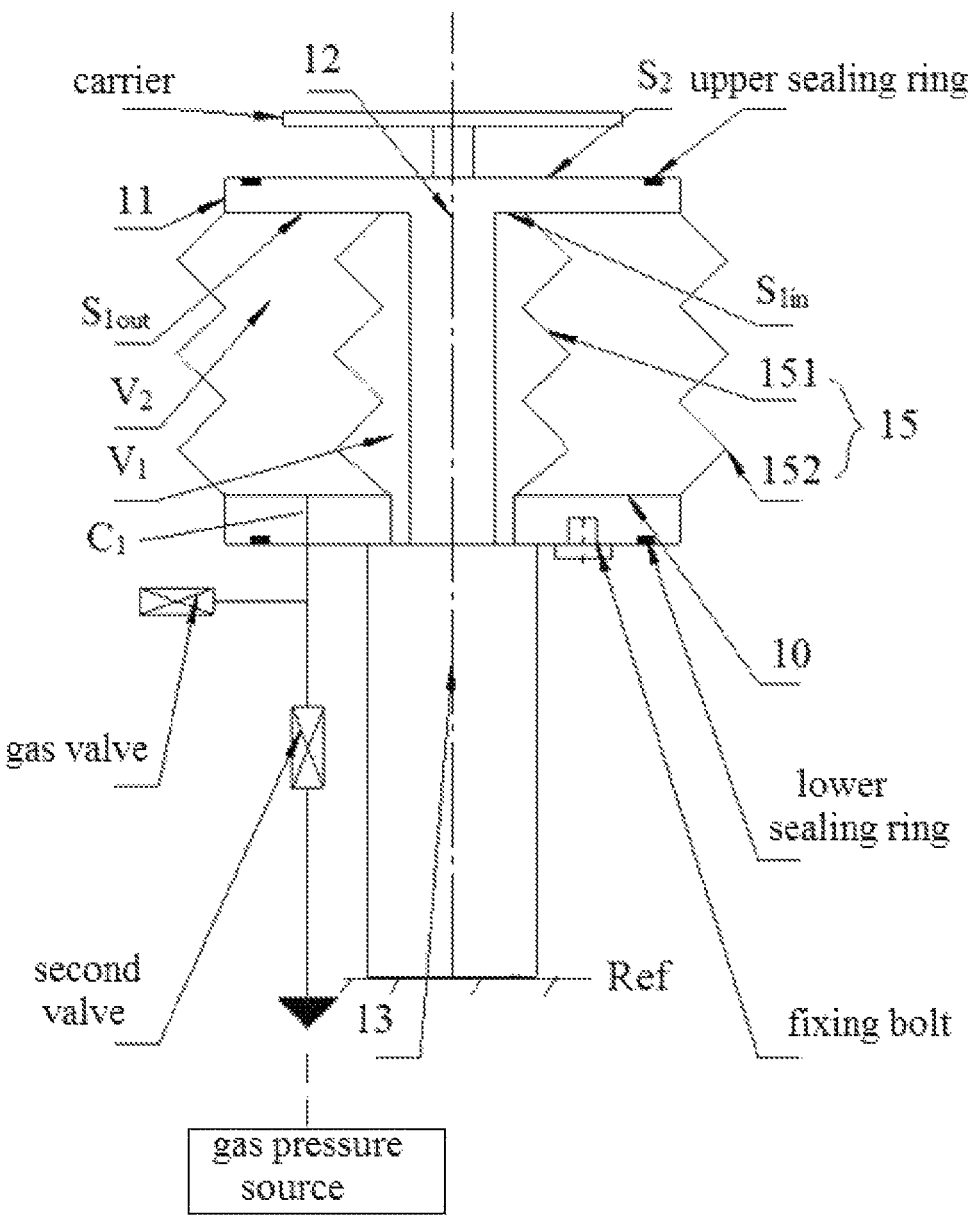
FIG. 1C illustrates a schematic view of another load-bearing device which is extendable and retractable, according to some other embodiments of the disclosure, wherein the second space communicates with a gas pressure source whose internal gas pressure is adjustable.

Alternatively or additionally, in embodiments of the present disclosure, as illustrated in FIG. 1B and FIG. 1C, by way of example, the corrugated tube assembly 15 further comprises an external tube 152 wrapped outside the first corrugated tube 151. And more specifically, an inner wall of the external tube 152 is spaced apart from an outer wall of the first corrugated tube 151, the external tube 152 is bonded (e.g., bonded by welding) at its lower edge to the base 10 in a sealed manner and bonded (e.g., bonded by welding) at its upper edge to the movable platform 11 in a sealed manner, with and the base 10, the movable platform 11, the first corrugated tube 151 and the external tube 152 cooperating with one another to define collectively a second space V2.

In one embodiment, as shown in FIG. 1B, by way of example, the second space V2 communicates, through a gas channel C1 formed to penetrate through the base 10, with a pressure environment at a side of the first surface S1 of the movable platform 11 (such communication is shown in a dashed line as illustrated).

As such, with such a setting, among others, the second space V2 communicating with the pressure environment at the first surface S1, then, in a condition that the pressure environment is a vacuum environment, substantially i.e., in such a condition that the scenario as shown in FIG. 1B may be simplified to be equivalent to a scenario that a structure as illustrated in FIG. 1A is disposed in a vacuum environment, such that in addition to the driving force applied onto the first surface S1 of the movable platform 11 by the driving member 13, a pressure of the atmospheric pressure acting onto the internal atmospheric-side area $S_{1in}$ also plays an auxiliary role to assist in driving the movable platform 11, thereby decreasing a magnitude of the driving force required to be applied.

Moreover, with such a setting, among others, the second space V2 communicating with the pressure environment at the first surface S1, for example the pressure environment is the atmospheric environment, then, in such a condition both the first space V1 and the second space V2 are in the atmospheric environment, that is, the atmospheric pressure not only acts on the area of the portion of the first surface S1 which portion is exposed to the first space V1 (i.e., the internal atmospheric-side area $S_{1in}$) and an area of another portion of the first surface S1 which portion is exposed to the second space V2 (hereinafter referred to as "external chamber-side area", but also simultaneously acts on the area of the portion of the second surface S2 corresponding to the internal atmospheric-side area $S_{1in}$ and an area of a portion of the second space S2 corresponding to the external chamber-side area labelled as $S_{1out}$ (more specifically, i.e., an area of a projection of the external chamber-side area $S_{1out}$ onto the side of the movable platform 11 facing away from the base 10), resulting in that respective pressures applied on both sides of the movable platform 11 are equalized/balanced, such that there is no pressure difference on the movable platform 11, thereby removing any additional gas pressure load acting on the movable platform 11. Thereby, no additional amount of the driving force is required to act on the movable platform 11 in order to overcome gas pressure load, thereby decreasing a magnitude of the driving force required to be applied.

Alternatively, in another embodiment, as illustrated in FIG. 1C, for example, the second space V2 communicates, through a gas channel C1 formed to penetrate through the base 10, with a gas pressure source whose internal gas pressure is adjustable.

As such, with such a setting, the pressure environment in the second space V2 may be adjusted by adjusting the gas pressure supplied by the gas pressure source, for example, by pumping gas into the second space V2 or by evacuating the second space V2 into vacuum. Thereby, optionally, the pressure applied to the external chamber-side area $S_{1out}$ of the movable platform 11 may for example equalize or exceed the gas pressure applied to the area of the movable platform 11 corresponding to the external chamber-side area $S_{1out}$, thereby reducing the driving force which is required, and facilitating flexible and dynamic adjustment of the requirement of the driving force to be applied onto the movable platform 11.

Figure 2A:
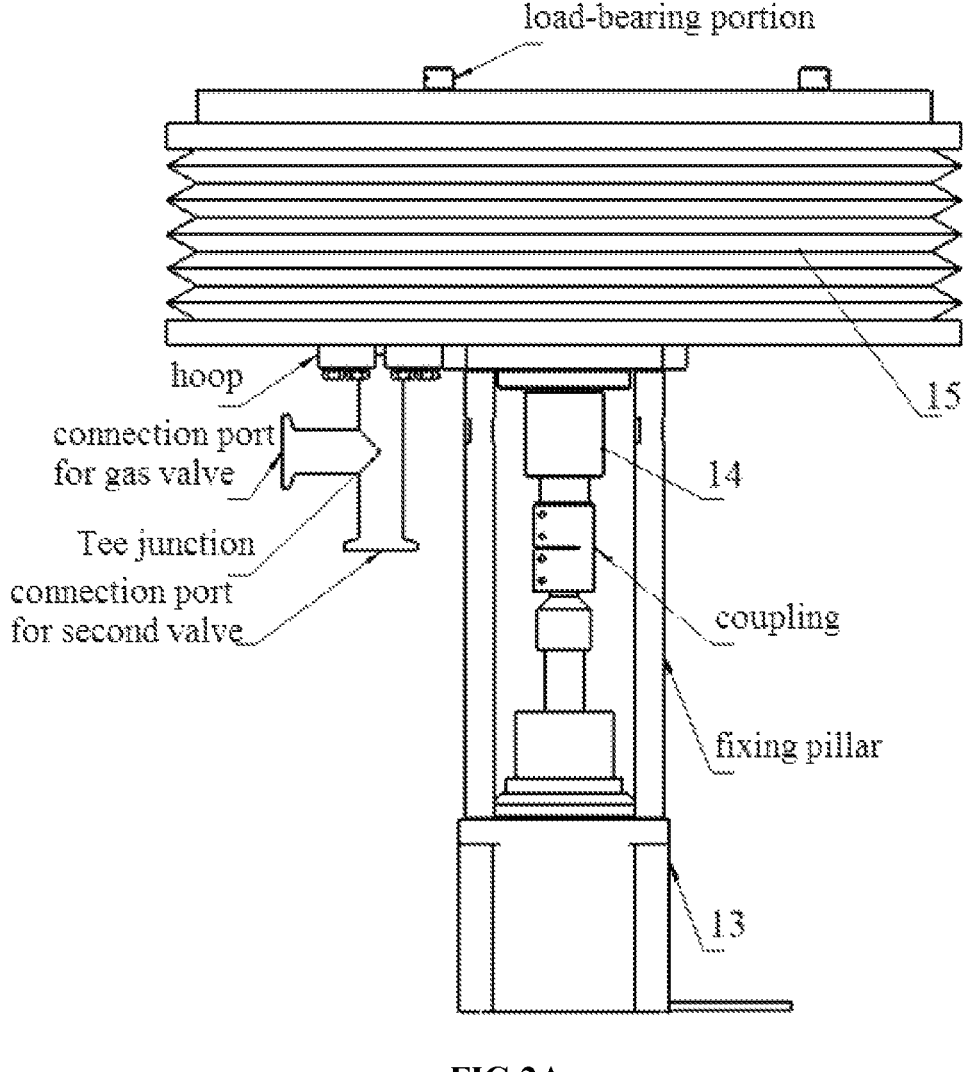
FIG. 2A illustrates a front view of the load-bearing device as illustrated in FIG. 1B.
Figure 2B:
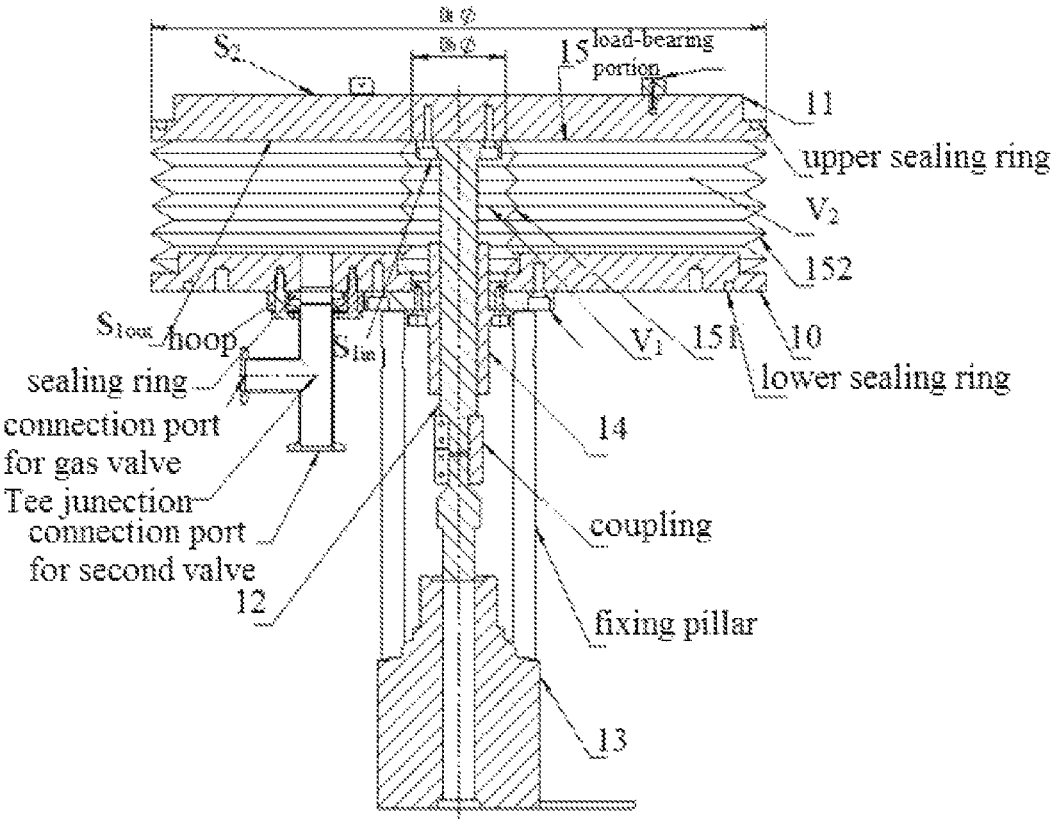
FIG. 2B illustrates a longitudinal sectional view of the load-bearing device as illustrated in FIG. 1B.
Figure 2C:
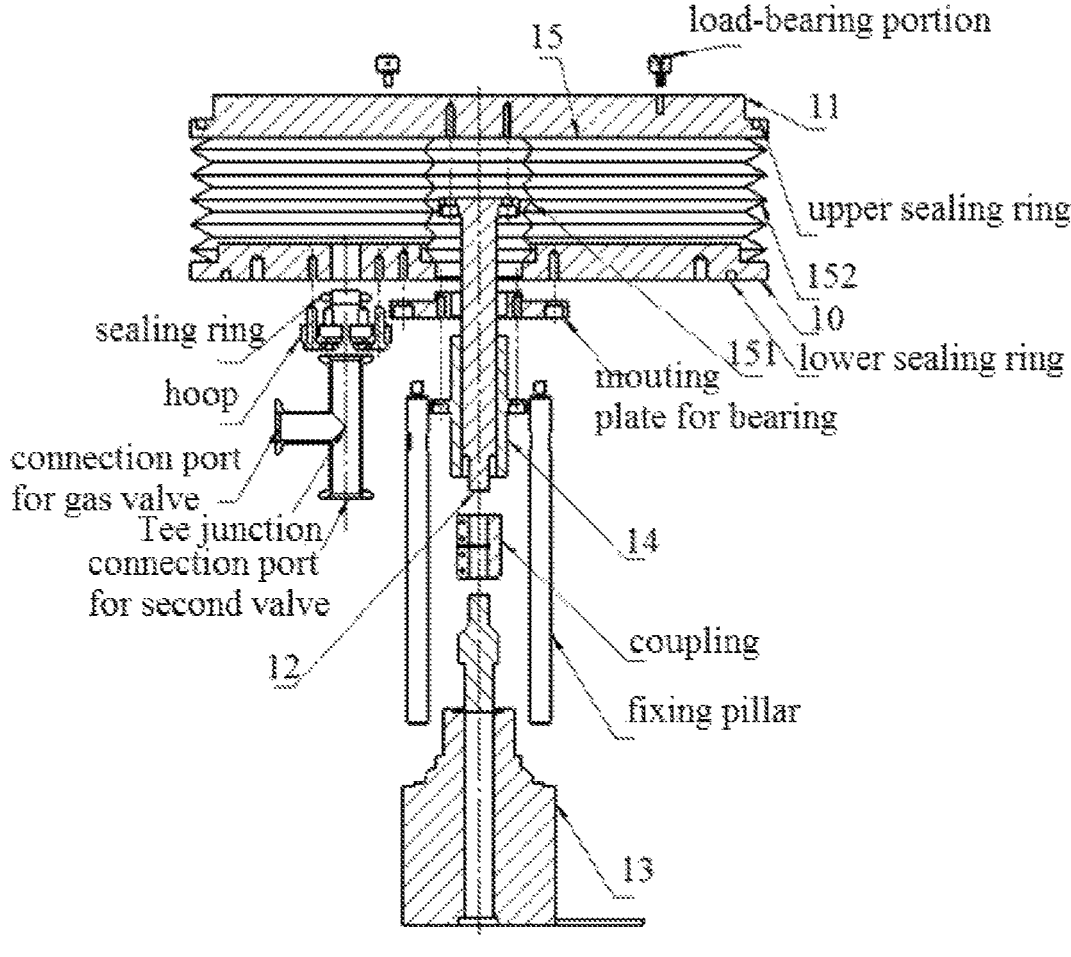
FIG. 2C illustrates an exploded view based on the longitudinal sectional view of the load-bearing device as illustrated in FIG. 2B.

FIG. 2A illustrates a front view of the load-bearing device 1 as illustrated in FIG. 1B. FIG. 2B illustrates a longitudinal sectional view of the load-bearing device 1 as illustrated in FIG. 1B. FIG. 2C illustrates an exploded view based on the longitudinal sectional view of the load-bearing device 1 as illustrated in FIG. 2B;

In more specific embodiments, as illustrated, by way of example, in the load-bearing device 1, the base 10 is for example a fixed flange connected to a bottom side of the corrugated tube assembly 15, and the movable platform 11 is for example a movable flange connected to an upper side of the corrugated tube assembly. And for example, the ejector rod 12 is connected to the movable platform 11 via screw(s), and the bearing 14 is mounted to a bearing mounting plate which is for example connected with the base 10 via bolt(s). The ejector rod 12 extends through the bearing 14 and the bearing 14 passes through and is mounted to the bearing mounting plate, and the driving member 13, which is for example a linear motor, is fixed onto the bearing mounting plate by means of a fixing pillar, and the motor and the ejector rod 12 are coupled with each other and integrated as a whole, through a coupling.

In specific embodiments of the present disclosure, for example, as illustrated in FIG. 2A to FIG. 2C, the movable platform 11 is provided with the first surface S1 facing towards the base 10 and the second surface S2 facing away from the base 10, both the first surface S1 and the second surface S2 being planar and perpendicular to an axis of the ejector rod 12. And typically, for example, an area of a portion of the first surface S1 defined/delimited between the first corrugated tube 151 and the external tube 152 (i.e., the external chamber-side area $S_{1out}$) being smaller than the area of the second surface S2. By way of example, in a condition that the area of the first surface S1 and the area of the second surface S2 are equal to each other (that is to say, for example as illustrated, in a condition that the movable platform 11 is in a form of a flat plate having a rectangular longitudinal section), this is naturally true. Alternatively, for example, in a condition that the area of the first surface S1 is not equal to the area of the second surface S2 (that is to say, alternatively, for example, in a condition that the movable platform 11 is in a form of a truncated cone having a longitudinal section of a trapezoidal shape or an inverted trapezoidal shape), such an arrangement is necessary, since it is possible to eliminate any requirement in considering an extra/additional pressure difference, which is introduced due to the fact that respective areas of two sides of the movable platform 11 opposite to each other are different from each other, for adjusting the driving force to be applied.

In further embodiments, for example, the area of the second surface S2 is not larger than the area of the first surface S1, By way of example, typically, in a condition that the movable platform 11 is for example in the form of a flat plate having a rectangular longitudinal section, the area of the second surface S2 is equal to the area of the first surface S1; alternatively, in a condition that the movable platform 11 is for example in the form of a truncated cone, then, the longitudinal section of the movable platform 11 is in the form of a trapezoidal shape, avoiding introduction of extra/additional gas pressure load resisting the driving force, thereby also facilitating avoidance of introducing an extra/additional amount of the driving force in order to overcome any additional pressure difference due to the fact that respective areas of two sides of the movable platform 11 opposite to each other are different from each other.

In embodiments of the disclosure, for example as illustrated in FIG. 1B and FIG. 1C, the external tube 152 is an external corrugated tube sleeved over and surrounding the first corrugated tube 151. Thereby, this facilitates a synchronous extension and retraction, by two corrugated tubes which are sleeved on each other and having different respective diameters (by way of example, the two corrugated tubes are for example formed by same material by using similar process/processes but merely differ in respective diameters).

In an alternative embodiment of the present disclosure, the external tube 152 is an extensible elastic sleeve which is axially compressed to a maximum extent in an initial state, with a maximum extension range thereof over which the elastic sleeve is elastically extensible in it axial direction being greater than that of the first corrugated tube 151. With such an arrangement, then, the synchronous extension and retraction of both the external tube 152 and the first corrugated tube 151 disposed therein may be realized, by taking advantage of elasticity of each of the elastic sleeve and the first corrugated tube 151, upon consideration a fact that both the elastic sleeve and the first corrugated tube 151 are coupled, in a sealed manner (i.e., hermetically) with the first surface S1 of the movable platform 11.

By way of example, the corrugated tube assembly 151 is made of a metallic material, which comprises one of the following: nickel, nickel alloy, stainless steel, titanium, titanium alloy, or a combination thereof.

Figure 3A:
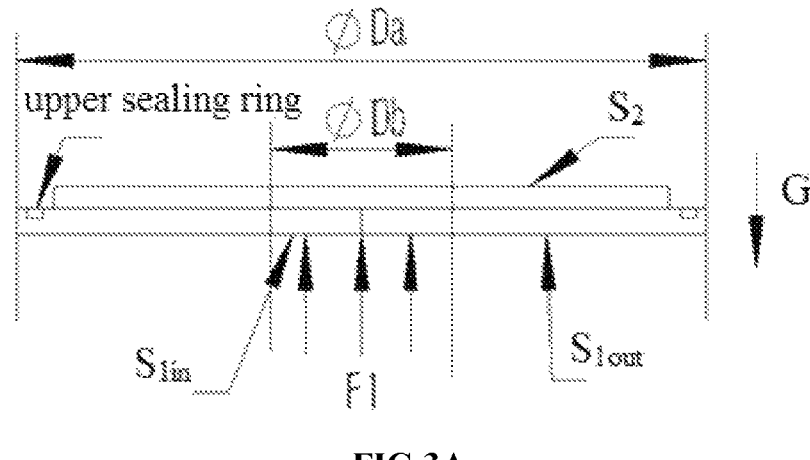
FIG. 3A and FIG. 3B exemplarily illustrate schematic force diagrams of the load-bearing device as shown in FIG. 1B operating in two different operation conditions, i.e., one condition being in a vacuum environment and the other condition being in an atmospheric environment, respectively.
Figure 3B:
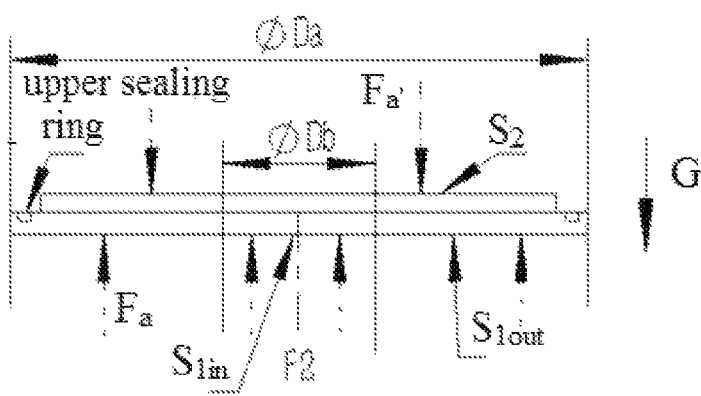

FIG. 3A and FIG. 3B exemplarily illustrate schematic force diagrams of the load-bearing device 1 as shown in FIG. 1B operating in two different operation conditions, i.e., one condition being in a vacuum environment and the other condition being in an atmospheric environment, respectively. Here, the atmospheric pressure is illustrated by dashed arrows.

In a first operation condition, as illustrated in FIG. 3A, for example, the load-bearing device 1 is placed vertically, and the side of the movable platform 11 facing away from the base 10 is disposed in a vacuum environment. And in this condition, once the gas channel C1 leading to the second space V2 (the second space V2 is defined collectively by the base 10, the movable platform 11, the first corrugated tube 151, and the external tube 152) is shut off and the second space V2 is already excavated into vacuum through the gas channel C1, then, the second space V2 becomes a closed space with its interior being a vacuum environment. In practical applications, by way of example, such a scenario may be typically concluded that: the load-bearing device 1 is placed in a vacuum environment entirely (i.e., as a whole), and merely the first space V1, which is defined/delimited collectively between the ejector rod 12 and the first corrugated tube 151, communicates with the atmospheric environment through the gap between the ejector rod 12 and the bearing 14. Thereby, as illustrated in FIG. 3A, then, a stress condition of the load-bearing device 1 may be summarized that: a thrust force (labelled as F1) applied onto the movable platform 11 by the driving member 13, via the ejector rod 12, is applied substantially vertically upwards; an atmospheric pressure applied onto the internal atmospheric-side area $S_{1in}$ of the movable platform 11 by the atmospheric environment is also applied substantially vertically upwards; and a gravity of the movable platform 11 itself is applied vertically downwards.

With above arrangement, since both the external chamber-side area $S_{1out}$ of the first surface S1 of the movable platform 11 facing towards the base 10 other than the internal atmospheric-side area $S_{1in}$, and the second surface S2 of the movable platform 11 facing away from the base 10, are exposed to the vacuum environment, then, the atmospheric environment merely applies the atmospheric pressure upwards on the internal atmospheric-side area $S_{1in}$. Thereby, merely the driving member 13 (e.g., a motor) applying a small thrust force is required, in cooperation with the atmospheric pressure which is applied vertically upwards on the internal atmospheric-side area $S_{1in}$, so as to overcome the gravity labelled as G of the movable platform 11 to maintain the movable platform 11 in a balanced state or even in a static/still state, in this scenario.

In a second operation condition, as illustrated in FIG. 3B, for example, the load-bearing device 1 is placed vertically, and the side of the movable platform 11 facing away from the base 10 is disposed in a vacuum environment. And in this condition, once the gas channel C1 leading to the second space V2 (the second space V2 is defined collectively by the base 10, the movable platform 11, the first corrugated tube 151, and the external tube 152) is opened, and the second space V2 already communicates with the atmospheric environment through the gas channel C1, then, the second space V2 becomes a space with its interior also being the atmospheric environment. In practical applications, by way of example, such a scenario may be typically concluded that: the load-bearing device 1 is placed in a vacuum environment entirely (i.e., as a whole), and the first space V1, which is defined/delimited collectively between the ejector rod 12 and the first corrugated tube 151, also communicates with the atmospheric environment through the gap between the ejector rod 12 and the bearing 14. Thereby, as illustrated in FIG. 3B, then, a stress condition of the load-bearing device 1 may be summarized that: a thrust force (labelled as F2) applied onto the movable platform 11 by the driving member 13, via the ejector rod 12, is applied substantially vertically upwards; an atmospheric pressure applied onto the first surface S1 of the movable platform 11 facing towards the base 10 by the atmospheric environment is also applied substantially vertically upwards; an atmospheric pressure applied onto the second surface S2 of the movable platform 11 facing away from the base 10 by the atmospheric environment is applied substantially vertically downwards; and the gravity of the movable platform 11 itself is also applied vertically downwards.

With above arrangement, since both the first surface S1 of the movable platform 11 facing towards the base 10, and the second surface S2 of the movable platform 11 facing away from the base 10, are exposed to the atmospheric environment, therefore, in a condition that the first surface S1 and the second surface S2 have exactly the same area, respective atmospheric pressures applied on the first surface S1 and the second surface S2 respectively by the atmospheric environment, are equal in magnitude and opposite in direction, such that the resultant force of the two atmospheric pressures applied on the first surface S1 and the second surface S2 respectively is zero. Thereby, the movable platform 11 is only subjected to both the gravity of itself, and the thrust force applied by the driving member 13. That is to say, it is merely required that, only if the driving member 13 applies the thrust force which is equal to or greater than the gravity of the movable platform 11 itself, the movable platform 11 may be maintained in a balanced state or even in a static/still state, in this scenario.

It may be seen therefrom that, the load-bearing device 1 based on the arrangement of embodiments of the disclosure, especially the corrugated tube assembly 15, comprises a double-layered arrangement formed by the first corrugated tube 151 and the external tube 152 wrapped outside the firs corrugated tube 151, e.g., a double-corrugated tube arrangement in which two corrugated tubes are sleeved on each other, then, as for the first surface S1 facing towards the base 10 and the second surface S2 facing away from the base 10, of the movable platform 11, both of which are provided opposite to each other, due to the aforementioned double-layered corrugated tube assembly 15, then, it facilitates ensuring that respective air pressures (if exist) acting on the external chamber-side area $S_{1out}$ of the first surface S1 and the respective area of the second surface S2 corresponding to the external chamber-side area $S_{1out}$, respectively, are always equal in magnitude and opposite in direction, and thus cancel each other, thereby decreasing a gas pressure difference between respective gas pressures applied respectively on upper surface and lower surface of the movable platform 11, and achieving the thrust force of the load-bearing device whose magnitude is as little as possible, in all of different operation conditions, such that as compared with a corrugated tube assembly of a single-layered structure in relevant art, a relatively low energy consumption of the driving member 13 is required and both stability and control on movement accuracy may be improved.

Figure 4A:
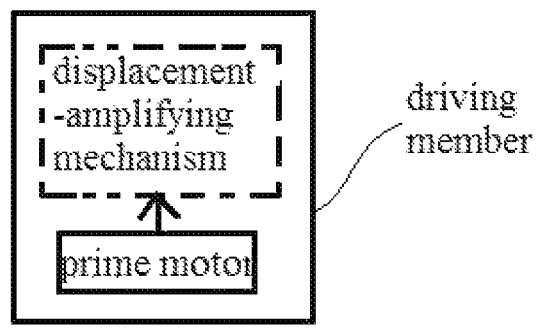
FIG. 4A illustrates a schematic structural block diagram of a driving member, according to some embodiments of the present disclosure.

FIG. 4A illustrates a schematic structural block diagram of a driving member 13, according to some embodiments of the present disclosure.

In embodiments of the present disclosure, for example, as shown in FIG. 4A, the driving member 13 comprises a prime motor 130.

By way of example, the prime motor 130 comprises a linear stepper motor with a trapezoidal lead-screw device, and such a motor has a mechanical self-locking function due to its trapezoidal lead screw structure. Therefore, it is convenient to precisely and progressively drive the movable platform 11 to extend or retract (i.e., to be telescopic) by means of the ejector rod 12 coupled between the driving member 13 and the movable platform 11, and in turn to realize a structural self-locking in case of mechanical failure, thereby improving motion stability, robustness in case of failure, and control of motion accuracy.

Alternatively, by way of example, the prime motor 130 may be one or more piezoelectric actuators, i.e., at least one piezoelectric actuator. A piezoelectric actuator has the advantage of having relatively quicker reaction time and relatively longer service life in terms of number of switches.

However, a piezoelectric actuator is only displaceable by a relatively small amount. In order to avoid the need for very large stacks of piezo electric material occupying a relatively large space, then, in further embodiments, for example, the driving member 13 further comprises a displacement-amplifying mechanism 131, which is coupled between the prime motor 130 and the ejector rod 12 and driven by the prime motor 130 and is configured to output a displacement amount thereof, which is larger than a displacement amount of the prime motor 130, at an end thereof connecting with the ejector rod 12 along a first direction in which the ejector rod 12 extends. Thereby, in a limited space, based on the prime motor 130 having a limited output displacement, the displacement amount output to the ejector rod 12 may be amplified by the displacement-amplifying mechanism 131, thereby saving space, making the structure compact, and reducing requirement for displacement output capacity of the prime motor 130.

Figure 4B:
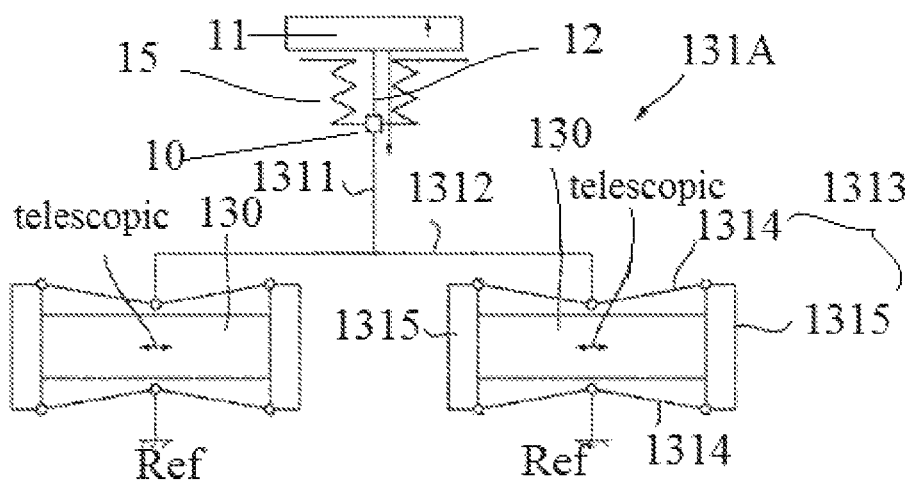
FIG. 4B illustrates a schematic structural view of a driving member comprising piezoelectric actuators, according to some embodiments of the present disclosure.
Figure 4C:
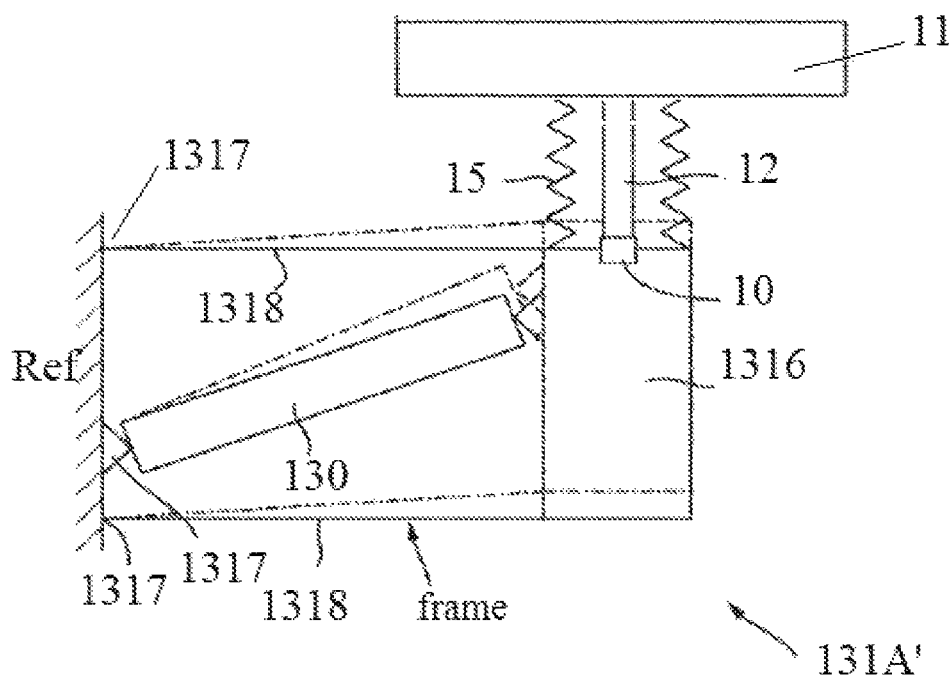
FIG. 4C illustrates a schematic structural view of a driving member comprising a piezoelectric actuator, according to some other embodiments of the present disclosure.
Figure 4D:
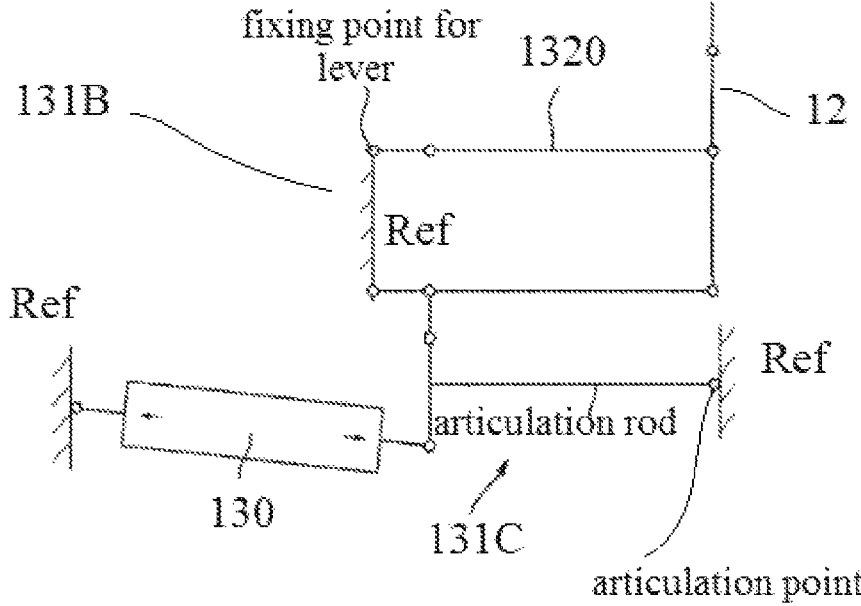
FIG. 4D illustrates a schematic structural view of a structure which is based on respective driving member as shown in FIG. 4B and FIG. 4C and is additionally provided with a lever for amplifying displacement.

FIG. 4B illustrates a schematic structural view of a driving member 130 comprising piezoelectric actuators 13, according to some embodiments of the present disclosure. FIG. 4C illustrates a schematic structural view of a driving member 130 comprising a piezoelectric actuator 13, according to some other embodiments of the present disclosure. FIG. 4D illustrates a schematic structural view of a structure which is based on respective driving member 13 as shown in FIG. 4B and FIG. 4C and is additionally provided with a lever for amplifying displacement.

In embodiments of the present disclosure, for example, as shown in FIG. 4B to FIG. 4D, the displacement-amplifying mechanism 131 comprises at least one of following: a linkage mechanism, and a leverage mechanism.

For example, as shown in FIG. 4B and FIG. 4C, a linkage mechanism functions as the displacement-amplifying mechanism 131, as illustrated. The linkage mechanism may be deemed as a range extender. In this way, a relatively small piezoelectric actuator may be used to achieve a relatively large range of motion of the ejector rod 12 coupled therewith. The use of piezoelectric actuators allows very precise positioning with a self-locking functionality in case of power failure, while also being reliable over an extremely long service life; in addition, the entire load-bearing device 1 has a relatively low thermal impact due to the use of piezoelectric actuators in combination with the amplification implemented by the linkage mechanism.

Furthermore, the at least one piezoelectric actuator is expected to be installed outside the base 10 of the load-bearing device 1, away from the ejector rod 12, the movable platform 11, and an associated gap between the ejector rod 12 and the bearing 14, as well as the first space V1 and the second space V2 as illustrated. This is advantageous because piezoelectric actuators frequently generate particles due to their ceramic nature. By maintaining the piezoelectric actuators outside the aforementioned components, and by means of a self-sealing structure of the corrugated tube assembly 15, any particles which are generated during the operation of the piezoelectric actuators will not find their ways into these components, or channels or spaces defined between or among these components.

In a specific embodiment of the present disclosure, for example, as illustrated in FIG. 4B, a linkage mechanism 131A is provided with components symmetrically arranged, whose displacements cancel each other out in opposite directions in a plane orthogonal to the first direction, such that the displacement-amplifying mechanism 131 has its degree of freedom of moving in the first direction at the end being unconstrained and other degrees of freedom thereof at the end being substantially constrained. Moreover, alternatively, by way of example, the prime motor 130 as illustrated may also be other driving mechanism(s), such as motor(s) and the like, more specifically for example, lead screw linear motor(s) or other micro-displacement mechanism(s).

In a more specific exemplary embodiment, as shown in FIG. 4B, the prime motor comprises one or more piezoelectric actuators, i.e., the at least one piezoelectric actuator, and the at least one piezoelectric actuator comprises two piezoelectric actuators arranged in a second direction orthogonal to the first direction, and the linkage mechanism comprises: a connecting member 1311, coupled to the ejector rod 12 along the first direction; a crossbar 1312 extending in the second direction and connected at a middle portion thereof with the connecting member 1311; and two motion reversing mechanisms 1313 which are arranged symmetrically on both sides in a lateral direction of the connecting member 1311 and are coupled with the two piezoelectric actuators in transmission relationship therewith in one-to-one correspondence, respectively.

As shown in FIG. 4B, for example, each motion reversing mechanism 1313 comprises: a pair of elongated deformable members 1314, symmetrically arranged on both sides of a respective piezoelectric actuator in the first direction and respectively extendable and retractable in the second direction by deforming at respective middle portions, wherein a middle portion of one elongated deformable member 1314 in the pair is coupled to the crossbar 1312 and a middle portion of the other elongated deformable member in the pair is fixed relative to the reference object Ref; and two connectors 1315, the pair of elongated deformable members being respectively connected at respective proximal ends with respect to the connecting member 1311 to one end of the respective piezoelectric actuator via one of the two connectors 1315, and respectively connected at respective distal ends with respect to the connecting member 1311 to the other opposite end of the respective piezoelectric actuator via the another one of the two connectors.

With this arrangement, both ends of each elongated deformable member 1314 are coupled, at the two connectors 1315, to opposite ends of the respective piezoelectric actuator, respectively. Each piezoelectric actuator extends longitudinally when a potential difference is applied thereon, causing the two ends of the respective elongated deformable member 1314 to be pulled away from each other. Therefore, the displacement amount of the middle portion of the respective elongated deformable member 1314 in the first direction is greater than an extension amount of each piezoelectric actuator itself, and the amplified displacement amount is transmitted to the connecting members 1311 via the crossbar 1312, and in turn to the ejector rod 12 and the movable platform 11.

Moreover, upon consideration of an arrangement for each piezoelectric actuator, a respective pair of elongated deformable members 1314 located on both sides thereof are symmetrically arranged in the first direction, with the middle portion of one elongated deformable member 1314 being coupled to the cross bar 1312 and the middle portion of the other elongated deformable member 1314 is fixed relative to the reference object Ref, which is for example the ground. As a result, with this arrangement, the deformation amount of each piezoelectric actuator is amplified twice, i.e., has two amplifications. Specifically, a first amplification is implemented by driving a lower elongated deformable member in the pair of elongated deformable members 1314 (i.e., the elongated deformable member 1314, which is located on the lower side of the piezoelectric actuator, in the pair of elongated deformable members 1314) to deform relative to the fixed reference object Ref, once the piezoelectric actuator is deformed, thereby forcing the piezoelectric actuator to be lifted up or lowered down accordingly via the opposite ends thereof coupled with the lower elongated deformable member 1314, and in turn forcing an upper elongated deformable member in the pair of elongated deformable members 1314 (i.e., the elongated deformable member 1314, which is located on the upper side of the piezoelectric actuator, in the pair of elongated deformable members 1314) to be also lifted up or lowered down accordingly. And the second amplification is due to the deformation of the upper elongated deformable member 1314 itself. Thus, the principle of this multiplicative displacement amplification functions in the same way as a vehicle jack.

In FIG. 4B, for example, two piezoelectric actuators are provided. However, it will be apparent to those skilled in the art to operate with only a single piezoelectric actuator or more than two piezoelectric actuators. Each piezoelectric actuator is configured to expand or contract on the application of a potential difference in the direction as illustrated by arrow 255, namely to the left and right as illustrated.

Then linkage mechanism is provided for transferring the dimensional change of the piezoelectric actuators as illustrated by arrow into upwards/downwards movement of the connecting member 1311 coupled with the ejector rod 12 (as illustrated).

Alternatively, in another specific embodiment of the present disclosure, e.g., as shown in FIG. 4C, the linkage mechanism 131A' has its components being arranged such that the displacement-amplifying mechanism 131 has its degree of freedom of moving in the first direction at the end being unconstrained and other degrees of freedom thereof at the end being substantially constrained, depending on assembly relationship among the components and dimensional constraints thereof. Furthermore, by way of example, as illustrated, the prime mover 130 may be the one or more piezoelectric actuators. Alternatively, by way of example, the prime mover 130 as illustrated may also be other driving mechanism(s), such as an electric motor(s) and the like, more particularly for example, lead screw motor(s).

In a more specific exemplary embodiment, as shown in FIG. 4C, for example, the linkage mechanism is constructed in a form of a frame and comprises a fixed portion 1317 which is fixed with respect to the reference object Ref and a movable portion 1316 which is displaceable in the first direction, as well as a coupling portion 1318 provided between the fixed portion 1317 and the movable portion 1316, with one end of the at least one piezoelectric actuator being hinged in a pivotable manner to the fixed portion 1317 of the frame and the other opposite end of the at least one piezoelectric actuator being attached to the movable portion 1316 of the frame; and the at least one piezoelectric actuator is provided at an angle with respect to a second direction orthogonal to the first direction, with the magnification being determined by the angle. This angle is for example an angle between 2° and 45°. The smaller the angle in which the at least one piezoelectric actuator extends relative to the second direction becomes, the larger the magnification of the movement of the linkage mechanism is. In order to ensure sufficient magnification, the angle of the at least one piezoelectric actuator to the second direction is preferably 45° or less, preferably 20° or less.

Thus, as illustrated, the movable portion 1316 of the frame is displaceable in the first direction (vertical direction) while being substantially constrained in a second direction (horizontal direction), and preferably also substantially constrained in a third direction orthogonal to both the first direction and the second direction (i.e., the third direction being a direction perpendicular to the sheet of drawing).

As an additional example, at least one additional piezoelectric actuator is provided, for example, which is connected in the same way as the at least one piezoelectric actuator as already illustrated and discussed above, and the at least one piezoelectric actuator as above and the at least one additional piezoelectric actuator are arranged side by side (for example, in a third direction perpendicular to a plane of the sheet of drawings) or stacked on each other (for example, side by side in the first direction which is vertical).

In embodiments of the present disclosure, based on the embodiment as illustrated in FIG. 4A, for example, the displacement-amplifying mechanism 131 merely comprises at least one lever which is directly coupled between the prime mover 130 and the ejector rod 12 and functions as a leverage mechanism, and the lever amplifies the displacement amount in the first direction output by the linkage mechanism as the displacement amount in the first direction output by the displacement-amplifying mechanism 131, by utilizing the lever principle.

In the embodiment of the present disclosure, based on the illustrated embodiments of FIG. 4B and FIG. 4C, for example, as shown in FIG. 4D, the displacement-amplifying mechanism 131 merely comprises at least one lever 1320 which is coupled between the linkage mechanism and the ejector rod 12 and functions as a leverage mechanism 131B, and the lever amplifies the displacement amount along the first direction output by the linkage mechanism as the displacement-amplifying mechanism, by utilizing the lever principle. By way of example, as shown in FIG. 4D, a linkage mechanism 131C is coupled to a lever of the leverage mechanism in a transmission relationship therewith in one-to-one correspondence, via an articulation rod that is pivotable relative to the reference object Ref (e.g., it is pivotally connected to the reference object Ref via a fixed hinged-joint point or a fixed articulation point), such that the linkage mechanism and the leverage mechanism cooperate with each other to amplify the displacement amount as output, by utilizing the lever principle.

The force from the piezoelectric actuators may be applied via the linkage mechanism. This has the effect of amplifying/magnifying the vertical (as illustrated) movement of the linkage mechanism as it is transmitted to the ejector rod 12 at the output end of the lever. In embodiments, the lever is for example selected to extend in a direction perpendicular to the plane of the sheet of the drawing, thereby providing rigidity against rotation in the plane of the sheet of the drawing.

FIG. 5A illustrates a schematic structural view of a wafer transfer device 2 according to embodiments of the disclosure, the wafer transfer device comprising the load-bearing device 1 as shown in FIG. 1B. FIG. 5B illustrates a schematic structural view of an arm assembly 30 of the wafer transfer device 2 as shown in FIG. 5A.

In embodiments of the present disclosure, according to the general technical concept of embodiments of the present disclosure, as shown in FIG. 5A and FIG. 5B, in another aspect of the embodiments of the present disclosure, a wafer transfer device 2 is also provided, the wafer transfer device 2 comprising: the load-bearing device 1 as discussed above, the load-bearing device 1 being arranged to function as a first carrier stage 20 which is liftable vertically by arranging the first direction to be in a vertical direction; a second carrier stage 21, which is also liftable vertically; and an arm assembly 30, provided between the first carrier stage 20 and the second carrier stage 21. Specifically, the arm assembly 30 comprises: a rotary shaft 31 which is vertically suspended, and a rotary arm 32, comprising a rod-shaped body 33 which is rotatably mounted at a lower end of the rotary shaft 31 around a vertical axis Z of the rotary shaft 31 and extends along a longitudinal axis O orthogonal to the vertical axis Z. By way of example, the rotary shaft 32 further comprises two supporting portions 34, which are formed respectively at both ends opposite to each other of the body 33, and are configured to rotate around the vertical axis Z so as to perform a wafer transfer action from a top of one of the first carrier stage 20 and the second carrier stage 21 to a top of the other of the first carrier stage 20 and the second carrier stage 21, by a supporting effect applied by the two supporting portions 34. By way of example, the first carrier 20 as illustrated is, for example, the aforementioned load-bearing device 1 or a portion thereof.

In embodiments of the present disclosure, typically for example as illustrated, the body 33 of the rotary arm 32 is a straight rod, and is rotatably mounted, at its midpoint around/about the vertical axis Z, to the lower end of the rotary shaft 31.

In embodiments of the present disclosure, for example, as illustrated, the rod-shaped body 33 is rotatably mounted, at its midpoint, to the lower end of the rotary shaft 31.

In embodiments of the present disclosure, for example, the wafer transfer device 2 further comprises a first motor 38 that is coupled with the rotary shaft 31 in a transmission relationship therewith in one-to-one correspondence and is configured to drive the rotary shaft 31 to rotate; and at least one second motor 39 that is coupled with the first carrier stage 20 and the second carrier stage 21 in a transmission relationship therewith and is configured to drive both the first carrier stage 20 and the second carrier stage 21 to perform a lifting and is configured to drive the rotating shaft 31 to rotate; At least one second motor 39 drivingly coupled with the second stage 21 is configured to drive the first stage 20 and the second stage 21 to perform a lifting-lowering motion.

Furthermore, in embodiments of the present disclosure, typically for example as illustrated, the arm assembly 30 is disposed between the first carrier stage 20 and the second carrier stage 21.

By way of example, the first carrier stage 20 and the second carrier stage 21 are for example arranged in a cylindrical shape or a column shape; and more preferably, each of the first carrier stage 20 and the second carrier stage 21, for example as illustrated, comprises a cylindrical or columnar base T1 of a relatively larger diameter and a telescopic rod T2 extending coaxially upwards from the cylindrical or columnar base T1, with the vertical axis Z of said rotary shaft 31 of said arm assembly being arranged parallel and equidistantly spaced from the axis of the first carrier stage 20 and the axis of the second carrier stage 21.

Furthermore, in a further embodiment, by way of example, the two supporting portions 34 are respectively located at opposite ends of the body 33, and are located at an equal distance from the midpoint of the body 33, respectively.

Thus, with above arrangement, the rotary arm 32 may rotate clockwise or counterclockwise around the vertical axis Z, and in turn facilitates that, when the rotary arm 32 is rotated such that the longitudinal axis O of the body 33 is coplanar with a first plane which is defined collectively by respective axes of both the first carrier stage 20 and the second carrier stage 21 of the wafer transfer device 2, the wafer to be transferred is switched from a state in which the wafer is supported by the first carrier stage 20 or the second carrier stage 21 solely into another state in which the wafer is individually supported by the respective supporting portion 34 adjacent to the first carrier stage or the second carrier stage which supports the wafer, solely. As such, a switching between different carriers for supporting/holding the wafer is realized with a simple configuration, specifically facilitating achieving the switching between different carriers by using a supporting function of the supporting portions 34 at ends of the rotary arm 42, instead of achieving the switching by a suction/adsorption effect in the relevant art such as a magnetic force, or a suction force of a suction cup, and in turn realizing a transfer of the wafer between different carrier stages by further rotation.

By way of example, in order to avoid interference with each other, for example, an orthographic projection of the support portions 34 on the base T1 of the respective one of the first carrier stage and the second carrier stage falls on a planar envelope of the base T1. As such, as long as the rotary arm 32 is sufficiently spaced apart from the respective one of the first carrier stage and the second carrier stage, then it facilitates ensuring that the wafer, when supported by the respective carrier stage, is spaced apart from the rotary arm 32 and fails to intersect with respective paths of supporting portions 34 at the ends of the rotary arm 32, thereby avoiding any unexpected collision.

In typical exemplary embodiments of the present disclosure, for example, as shown in FIG. 5B, each supporting portion 34 comprises at least one plate-shaped supporting member perpendicular to the vertical axis Z, with a minimum distance between respective supporting members of the two supporting portions 34 being larger than a minimum distance between edges of respective top surfaces of the first carrier stage 20 and the second carrier stage 21, and with a maximum distance between respective supporting members of the two supporting portions 34 being smaller than a maximum distance between the edges of respective top surfaces of the first carrier stage 20 and the second carrier stage 21. Moreover, each supporting member is arranged to be spaced apart from each of the first carrier stage 20 and the second carrier stage 21 in any plane perpendicular to the vertical axis Z during rotation of the rotary arm 32 about the vertical axis Z. As such, it ensures that each supporting member is arranged to be not in contact with each of the first carrier stage 20 and the second carrier stage 21 when the rotary arm 32 rotates around the vertical axis Z.

Thus, with above arrangement, it prevents each supporting member from coming into contact with each of the first carrier stage 20 and the second carrier stage 21 during the rotation of the rotary arm 32 around the vertical axis Z, such that the path of each supporting member during the rotation fails to intersect with either of the first carrier stage 20 and the second carrier stage 21, thereby avoiding occurrence of mutual interference, contact and collision between each supporting member of the arm assembly 30 and the first and second carrier stages. Thereby, it facilitates a free rotation of the rotary arm 32, such that the wafer may be smoothly transferred between respective tops of the first carrier stage 20 and the second carrier stage 21 by using the supporting portions 34 as an medium (i.e., a transfer carrier), specifically by means of a supporting effect applied by the plate-shaped supporting members.

Based on the schematic structural view of an exemplary wafer transfer device 2 as depicted in FIG. 5A, an operation principle of the wafer transfer device 2 according to embodiments of the present disclosure is briefly described below.

In exemplary embodiments, when the rotary arm 32 is rotated to a first position, where the longitudinal axis O is perpendicular to the first plane defined collectively by respective axes of the first carrier stage 20 and the second carrier stage 21, then respective top surfaces of the first carrier stage 20 and the second carrier stage 21 are flush with each other. Thereby, the wafer is supported merely by a top of one of the first carrier stage 20 and the second carrier stage 21, and is spaced apart from the rotary arm 32.

Then, in exemplary embodiments, when the rotary arm 32 is rotated by 90 degrees from the first position to a second position, where the longitudinal axis O is coplanar with the first plane, the first carrier stage 20 and the second carrier stage 21 are lowered such that the respective top surfaces of the first carrier stage 20 and the second carrier stage 21 are located lower than respective upper portions of the two supporting portions 34, so as to transfer the wafer from one of the first carrier stage 20 and the second carrier stage 21 to the respective supporting portion 34. Thereby, the wafer is merely supported by a respective upper portion of one supporting portion 34, which is located below the wafer, of the two supporting portions 34.

Furthermore, in exemplary embodiments, when the rotary arm 32 continues to be rotated by 180 degrees from the second position to a third position, where the longitudinal axis O is once again coplanar with the first plane defined collectively by respective axes of the first carrier stage 20 and the second carrier stage 21, then the first carrier stage 20 and the second carrier stage 21 are elevated such that the respective top surfaces of the first carrier stage 20 and the second carrier stage 21 are located higher than respective upper portions of the two supporting portions 34, so as to transfer the wafer from the supporting portion 34 carrying the wafer to the other one carrier stage of the first carrier stage 20 and the second carrier stage 21. Thereby, the wafer is transferred and is merely supported by the upper portion of the other of the first carrier stage 20 and the second carrier stage 21. In this way, the transfer of the wafer between the first stage 20 and the second stage 21 is completed.

Embodiments of a specific configuration of the arm assembly 30 (in particular, the two supporting portions 34 of the rotary arm 32 therein) will be described in further detail below.

As an exemplary embodiment of the present disclosure, each of the two supports 34 in the arm assembly 30 may typically be of a planar configuration.

In a more specific embodiment, for example as shown in FIG. 5B, in a condition that the two supporting portions 34 are of planar construction, respectively, the two supporting portions 34 are constructed to be two curved plate-shaped supporting members extending to two sides of the body 33 opposite to each other, respectively, in a supporting plane perpendicular to the vertical axis Z, each plated-shaped supporting member being provided with an upper surface perpendicular to the vertical axis Z.

FIG. 5C illustrates a schematic structural view of an alternative supporting portion of an arm assembly of the wafer transfer device In an alternative embodiment, for example as illustrated in FIG. 5C, in a condition that each of the two supporting portions 34 has a three-dimensional configuration, each supporting portion 34 comprises: a first supporting disk, formed at a respective end of the body 33; at least one pair of cantilevers, each being in a form of L-shape that is suspended from a lower surface of the first supporting disk and being provided with an end directing inwards in a radial direction of the first supporting disk; and at least one pair of plate-shaped supporting member respectively formed at respective ends of the at least one pair of cantilevers, each plate-shaped supporting member being provided with respective upper surface perpendicular to the vertical axis Z.

The wafer transfer device 2 comprises the load-bearing device 1 as above, and accordingly has specific construction and corresponding technical effect similar to those of the latter, which will not be repeatedly discussed here.

FIG. 6A to FIG. 6D respectively illustrate schematic views of various steps in a working flow of a chamber device 3 for exchanging wafers between different pressure environments, according to embodiments of the disclosure, the chamber device 3 comprising the wafer transfer device 2 as shown in FIG. 5A.

In embodiments of the present disclosure, according to the general technical concept of embodiments of the present disclosure, as shown in FIG. 6A to FIG. 6D, in another aspect of embodiments of the present disclosure, a chamber device 3 configured to exchange a first wafer W1 and a second wafer W2 between different pressure environments, is also provided, the chamber device comprising: a first housing 40, defining an interior vacuum chamber delimited therein as a first pressure environment and defining an outside of the first housing 40 as a second pressure environment, the first housing 40 being further provided with an opening 50 communicating between the first pressure environment and the second pressure environment; and the wafer transfer device 2 as above, which is provided inside the vacuum chamber, with the first carrier stage 20 being arranged to at least partially overlap with the opening 50. More specifically, for example, the wafer transfer device 2 further comprises a valve plate 60, which is co-axially provided on the first carrier stage 20 and is configured to be elevated or lowered with the first carrier stage 20 so as to close or open the opening 50.

In embodiments of the present disclosure, for example, in the chamber device 3, the first wafer W1 and the second wafer W2 are simultaneously supported by the first carrier stage 20 and the second carrier stage 21 respectively, or simultaneously supported by the two supporting portions 34 respectively.

In embodiments of the present disclosure, by way of example, one of the first carrier stage 20 and the second carrier stage 21 that at least partially overlaps with the opening 50 (i.e., a carrier stage that is closer to the opening 50), is configured to be able to be raised (i.e., configured to be liftable) such that a top portion thereof enters the second pressure environment.

As shown in FIG. 6A to FIG. 6D, specific working flow of the chamber device 3 is briefly discussed as follows.

Figure 6A:
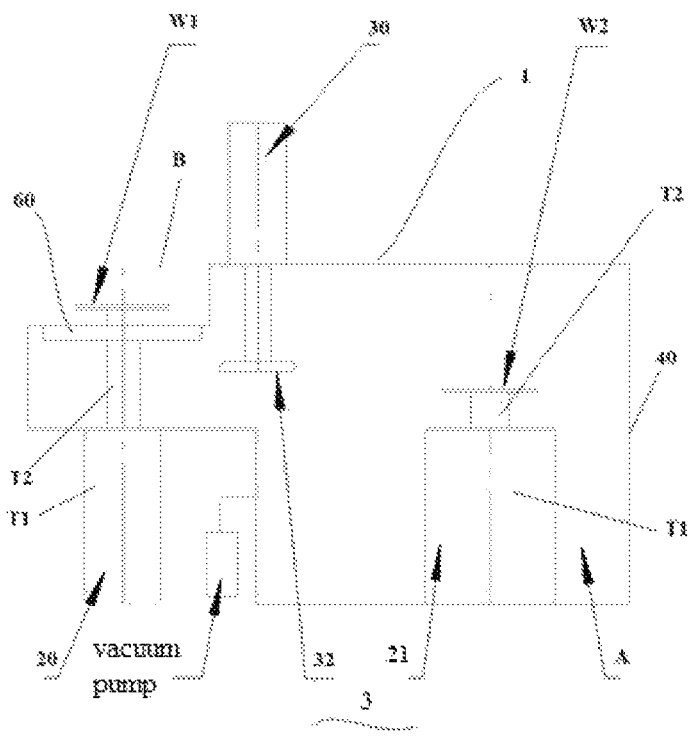
FIG. 6A to FIG. 6D respectively illustrate schematic views of various steps in a working flow of a chamber device for exchanging wafers between different pressure environments, according to embodiments of the disclosure, the chamber device comprising the wafer transfer device as shown in FIG. 5A.
Figure 6B:
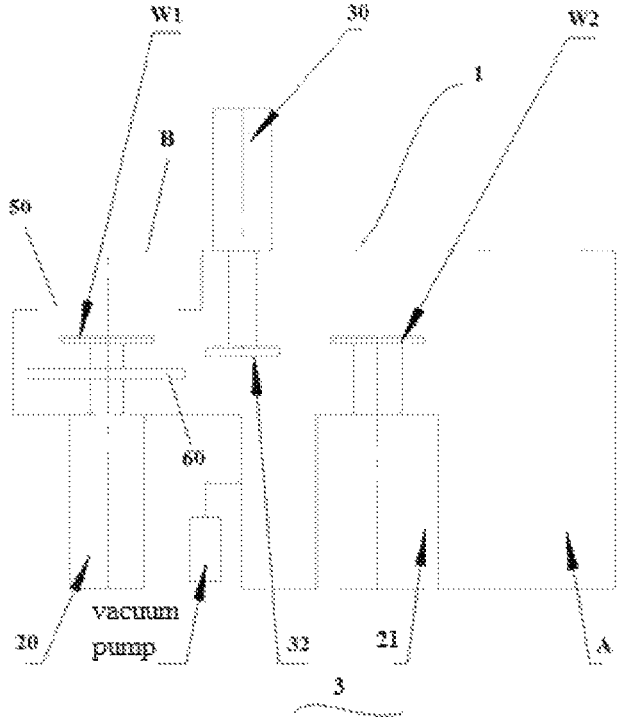
Figure 6C:
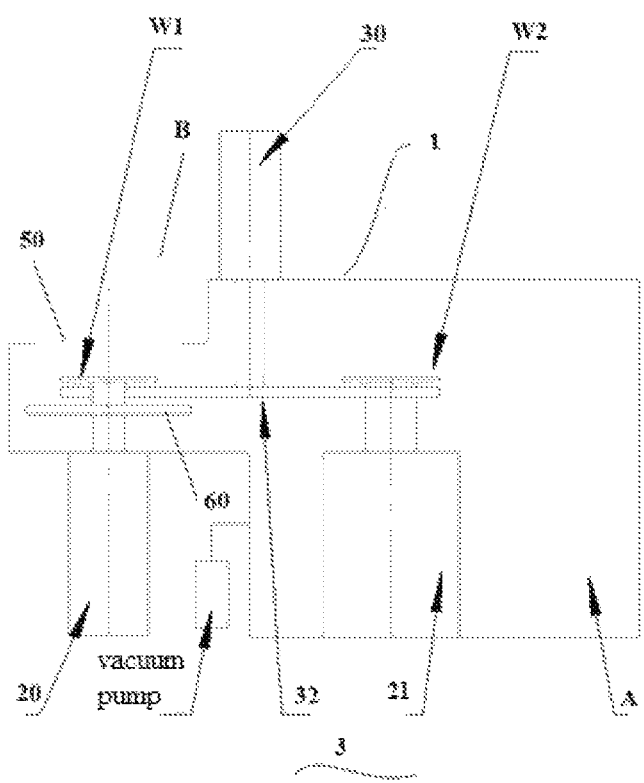
Figure 6D:
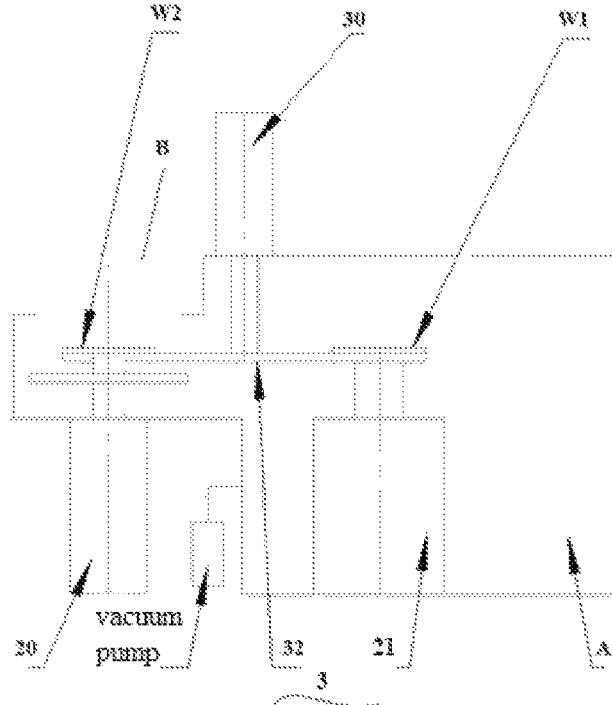

As shown in FIG. 6A, above all, the second pressure environment outside the first housing is adjusted, for example, by a vacuum pump and/or an inflation valve, such that a pressure of the second pressure environment is equalized with that of the first pressure environment (e.g., vacuum) inside the first housing. Once a pressure requirement is met, the valve plate 60 is lowered with the lowering of one of the first carrier stage 20 and the second carrier stage 21 to which the valve plate 60 is mounted or fixed, and which at least partially overlaps with the opening 50, thereby opening the opening 50 which is already initially closed by the valve plate 60, and in turn opening the opening 50 which communicates between the interior and exterior of the first housing. Thus, the valve plate 60 and the opening 50 cooperate with each other to function as a valve between the interior and exterior of the first housing. In such a condition, also due to the lowering of one of the first carrier stage and the second carrier stage which at least partially overlaps with the opening 50, for example lowering to an degree that the top thereof is flush with that of the other one of the first carrier stage and the second carrier stage, then, the wafer transferred from the respective top of the other one of the first carrier stage and the second carrier stage is loaded to the one carrier stage which is lowered so as to be further transferred to the outside of the first housing. FIG. 6B to FIG. 6D illustrate a condition in which the interior of the first housing communicates with the exterior of the first housing. A pressure distribution inside and outside the first housing corresponds to the state of various steps in the working flow of the wafer transfer device 2 as described above, which will not be repeatedly discussed here. Thus, it is achieved that the chamber device 3 utilizes the wafer transfer device 2 to exchange wafers in a circulatory way between different pressure environments.

With this arrangement, the chamber device 3, by means of the aforementioned wafer transfer device 2 disposed inside the vacuum chamber, achieves a function similar to that of the aforementioned chamber device functioning as a wafer exchange device, specifically transfers a wafer which is carried by one of the first and second carrier stages located at a portion of the vacuum chamber more deeply into its interior to the other carrier stage of the first and second carrier stages at least partially overlapping with the opening 50; further, the wafer carried by the other carrier stage of the first and second carrier stages at least partially overlapping with the opening 50 is further moved into the second pressure environment outside the first housing, by a lifting action of the other carrier stage, thereby realizing a function of exchanging two different wafers between different pressure environments with a simple structure.

The chamber device 3 comprises the wafer transfer device 2 as above, and in turn comprises the load-bearing device 1 as above, and accordingly has specific construction and corresponding technical effect similar to those of the wafer transfer device and the load-bearing device, which will not be repeatedly discussed here.

Figure 7:
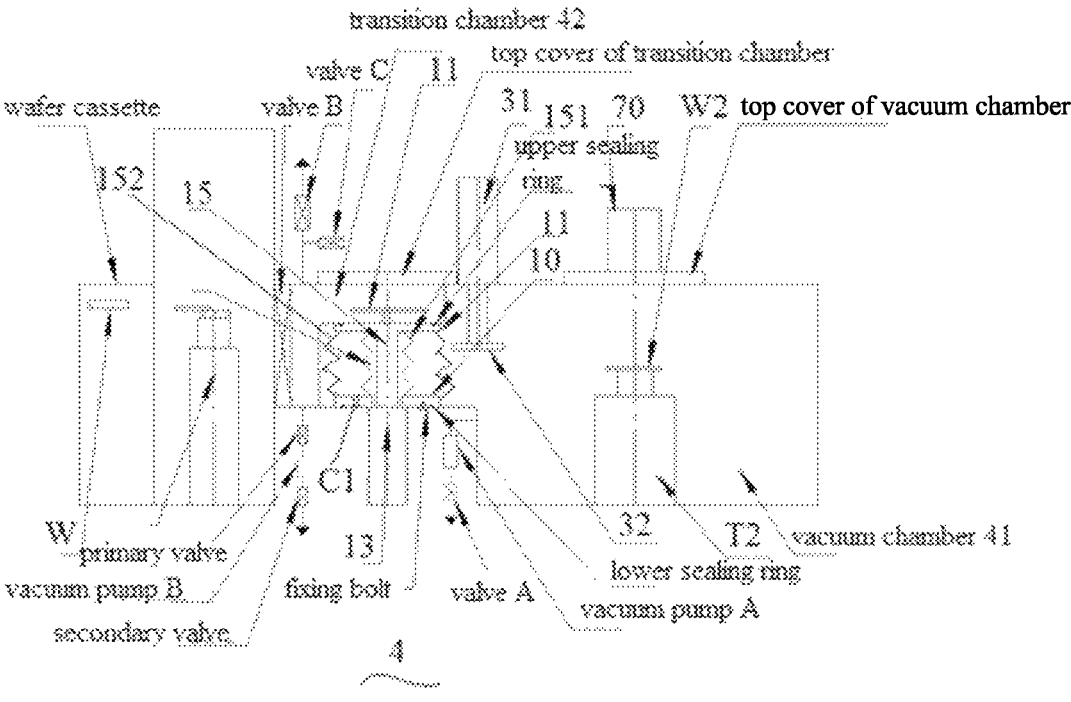
FIG. 7 illustrates a schematic view of a wafer processing apparatus according to embodiments, the wafer processing apparatus comprising the chamber device as shown in FIG. 6A to FIG. 6D.
Figure 8:
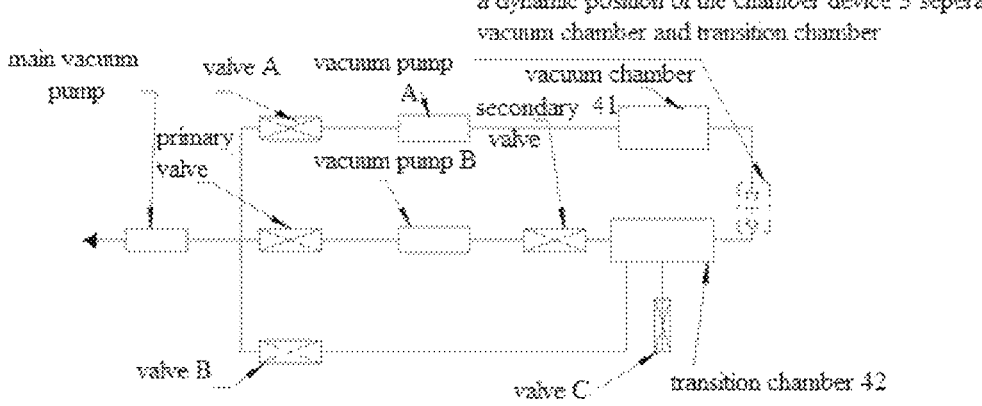
FIG. 8 illustrates a schematic layout diagram of a gas passage in the wafer processing apparatus as illustrated in FIG. 7, with respective arrangements of valves and pumps throughout the figure, exemplarily.

FIG. 7 illustrates a schematic view of a wafer processing apparatus 4 according to embodiments, the wafer processing apparatus 4 comprising the chamber device 3 as shown in FIG. 6A to FIG. 6D. FIG. 8 illustrates a schematic layout diagram of a gas passage in the wafer processing apparatus 4 as illustrated in FIG. 7, with respective arrangements of valves and pumps throughout the figure, exemplarily.

In embodiments of the present disclosure, according to the general technical concept of embodiments of the present disclosure, as shown in FIG. 7 and FIG. 8, in combination with FIG. 3A to FIG. 3B, then, in yet another aspect of embodiments of the present disclosure, a wafer processing apparatus 4 is further provided, the wafer processing apparatus 4 comprising: a first housing 40, defining an interior vacuum chamber 41, in which a wafer processing device or a wafer detection device, is installed (labeled by 70) (the wafer processing device for example comprises but is not limited to an exposure device, a developing device, a patterning device, and the like; and the wafer detection device for example comprises but is not limited to a scanning electron microscope and the like; the wafer processing device or the wafer detection device 70 processes or detects a wafer to be processed on one of the first and second carrier stages, e.g., the second carrier stage 21, for example via a top cover on the first housing 40); the wafer transfer device 2 as above; and a second housing 80, which is disposed adjacent to the first housing 40 and defines a transition chamber 42 therein.

In embodiments of the present disclosure, by way of example, the first housing 40 is formed with an opening 50 communicating to the second housing 80, and the first carrier stage 20 of the wafer transfer device 2 is arranged to at least partially overlap with the opening 50; and the wafer transfer device further comprises a first valve plate 60, which is co-axially provided on the first carrier stage 20 and is configured to be elevated or lowered with the first carrier stage 20 so as to close or open the opening 50. Furthermore, for example, the transition chamber 42 communicates, via the opening 50 at one side thereof, with the vacuum chamber 41, and also communicates via a second valve at the other side thereof with the atmospheric environment. Moreover, by way of example, the wafer processing apparatus further comprises a robotic arm disposed outside the first housing 40 and configured to move the wafer between the atmospheric environment and the transition chamber 42. For the sake of brevity, a complete structure of the wafer transfer device 2 is not shown, with merely a left carrier stage, which is provided with the valve plate 60, in the wafer transfer device 2 being illustrated.

In embodiments of the present disclosure, by way of example, in essence, the aforementioned movable platform 11 functions as the first valve plate 60 here; and more specifically, as illustrated in FIG. 1A and FIG. 1B, with an upper sealing ring provided on the upper surface of the movable platform 11, then, when the movable platform 11 is in a high position (i.e., the first valve plate 60 completely closes the opening 50 between the transition chamber 42 and the vacuum chamber 41), the transition chamber 42 is spaced apart from the vacuum chamber 41; and as illustrated in FIG. 1A and FIG. 1B, as for the load-bearing device 1 of the present disclosure, the base 10 is mounted to the housing (e.g., its inner bottom) by fixing bolts and a lower sealing ring located at the lower surface of the base 10.

By way of example, a vacuum degree of the vacuum chamber 41 is adjusted by using the vacuum pump communicating with the vacuum chamber 41, and the pressure environment in the transition chamber 42 is adjusted by using the inflation valve and the vacuum pump both communicating with the transition chamber 42, such that, when the transition chamber 42 is required to communicate with the atmospheric environment, a pressure in the second housing 80 is equalized/balanced with the atmospheric environment; and when the transition chamber 42 is required to communicate with the vacuum chamber 41, a pressure of a vacuum environment in the first housing 40 is equalized/balanced with that of the an atmosphere in the second housing 80.

With this arrangement, the wafer processing device 4, by means of the aforementioned wafer transfer device 2 disposed inside the vacuum chamber 41, achieves a function similar to that of the aforementioned chamber device functioning as a wafer exchange device, specifically transfers a wafer which is carried by one of the first and second carrier stages located at a portion of the vacuum chamber 41 more deeply into its interior to the other carrier stage of the first and second carrier stages at least partially overlapping with the opening 50; further, the wafer carried by the other carrier stage of the first and second carrier stages at least partially overlapping with the opening 50 is further moved into the second pressure environment outside the first housing, by a lifting action of the other carrier stage, thereby realizing a rotary wafer-transferring way with a simple structure, instead of a conventional translational wafer-transferring way in the art, thereby realizing a function of automatic wafer exchange and wafer transfer between the vacuum chamber 41 and the transition chamber 42 in a limited space. And by means of the movement of the robotic arm, the function of exchanging and transferring wafers may be further realized between the transition chamber 42 and the atmospheric environment. This facilitates automated continuous wafer processing and detection.

The wafer processing apparatus 4 comprises the wafer transfer device 2, and in turn comprises the load-bearing device 1 as above, and accordingly has specific construction and corresponding technical effect similar to those of the wafer transfer device and the load-bearing device, which will not be repeatedly discussed here.

In embodiments of the present disclosure, by way of example, as shown in the schematic layout diagram of a gas passage in FIG. 8, in view of schematic structural view of the wafer processing apparatus 4 comprising the chamber device as illustrated in FIG. 7, the movable platform 11 is provided with three stop positions, namely, a high position, a middle position, and a low position. Among others, at the high position, an isolation from the vacuum chamber 41 and a pickup and placement of wafer at the atmospheric-side may be realized; at the middle position, a communication between the transition chamber 42 and the vacuum chamber 41 and a pickup of wafer at the vacuum-side may be realized; and at the low position, a communication between the transition chamber 42 and the vacuum chamber 41 and a placement of wafer at the vacuum-side may be realized. When the driving member 13 (e.g., a motor) of the movable platform 11 receives a signal, and the ejector rod 12 is guided by the bearing 14, then axial movement of the movable platform 11 (e.g., a movable flange) of the corrugated tube assembly 15 terminates at the high position, the middle position and the low position, respectively.

Regarding specific changes in respective gas pressure environments of various chambers and the processes of pickup and placement of wafer, in exemplary embodiments of the present disclosure, by way of an example, as illustrated, especially as illustrated in FIG. 7 and FIG. 8: Above all, the wafer is picked up from a wafer cassette, and then a center position of the wafer is preliminarily positioned. At the same time, the valve C inflates the transition chamber 42, and at the moment the movable platform 11 is at the high position, and the transition chamber 42 is separated from the vacuum chamber 41 by the upper sealing ring. Once a pressure requirement for equalizing/balancing with an atmospheric environment is met, the second valve that communicates with the atmospheric environment is opened, the robotic arm disposed on the atmospheric side takes out a wafer which is already completed in previous process, from the transition chamber 42; and at the same time, the robotic arm on the atmospheric side again puts in the wafer to be processed this time. Then the second valve is closed and the valve B is opened, and a main vacuum pump starts to evacuate the transition chamber 42. Once a certain degree of vacuum is reached, the valve B is closed, and a primary-stage valve and a secondary-stage valve are opened, two vacuum pumps A and C evacuate the transition chamber 42 simultaneously. Once the interlocking vacuum chamber 41 reaches a preset vacuum pressure requirement, under an action of a driving device 27 for the wafer transfer mechanism, then the movable platform 11 thereof moves downwards to the middle position. At that time, the transition chamber 42 communicates with the vacuum chamber 41, and wafers W1 and W2 are located at the same height and each of them keeps a certain safety distance from the rotary arm 32 of the arm assembly 30, and the carrier stage on the right side as illustrated in the vacuum chamber 31 (e.g., the second carrier stage 21 as above) is at a loading position or a unloading position for wafer. At that time, the rotary arm 32 is driven to rotate 90° counterclockwise from the safety position to reach the lower side of both wafers W1 and W2, i.e., the load-bearing device 1 and the second carrier stage 21 drive the wafers W1 and W2 respectively to move downwards to the low position, such that the wafers W1 and W2 are separated from the load-bearing device 1 and the second carrier stage 21 respectively and are carried on the upper surface of the rotary arm 32 to complete the pickup of wafers; then the rotary arm 32 further rotates 180° counterclockwise so as to exchange positions of the wafers W1 and W2, and next, the load-bearing device 1 and the second carrier stage 21 drive the wafers W1 and W2 respectively to move upwards to the middle position, such that the wafers W1 and W2 are separated from the rotary arm 32 and are carried on the upper surfaces of the movable platform 11 and the second carrier stage 21 to complete placement of wafers. After above actions are completed, the rotary arm 32 rotates back 90° clockwise to reach the safety position, and the load-bearing device 1 moves upwards to the high position, and the transition chamber 42 and the vacuum chamber 41 are separated from each other, the wafer W2 is in the processing stage, and the valve C starts to inflate the transition chamber 42. Once a pressure requirement for equalizing/balancing with an atmospheric environment is met, the second valve is opened, and next wafer-transferring and processing flow is started.

Thus, the embodiments of the present disclosure have the following superior technical effects:

In embodiments of the present disclosure, a load-bearing device 1 is provided, which utilizes a corrugated tube assembly 15 of a double-layered structure to achieve a simultaneous inflation or evacuation (into vacuum) on opposite sides of a movable platform 11 which is provided for the purpose of bearing/carrying load, ensuring that respective gas pressures applied on most areas on both sides of the movable platform 11 are equal in magnitude and opposite in direction, thereby reducing a pressure difference between upper and lower sides of the movable platform 11 associated with the corrugated tube assembly 15, and in turn decreasing magnitude of driving force and improving reliability and maintainability of driven displacement of the entire structure, with fewer components and a relative simple coupling and assembly relationship, resulting in a relatively compact structure and reduced cost. And during the movement, a relatively high control accuracy is achieved, as well as relatively low noise and relatively low energy consumption.

Furthermore, in embodiments of the present disclosure, a wafer transfer device 2, a chamber device 3, and a wafer processing apparatus 4 are provided, which utilize a rotary wafer-transferring way, instead of a conventional translational wafer-transferring way in the art, and use valve plate 60 which is disposed on one of two liftable carrier stages to close or open an opening 50 between different pressure environments, thereby realizing an integrated design of the vacuum chamber 41 which is relatively simple and compact, not only strengthening strength of the vacuum chamber but also making layout of parts thereof more compact, such that the entire apparatus occupies a relatively smaller area, that is, the economy of the equipment is improved. In addition, time periods for evacuating into vacuum (i.e., vacuuming), inflation, and wafer-transferring are effectively shortened, that is, equipment efficiency is improved (for example, in the present disclosure, area occupied by the wafer processing apparatus 4 using the wafer transfer device 2 is reduced by 30%, and time periods for evacuating into vacuum (i.e., vacuuming), inflation, and wafer-transferring are reduced by 50%); at the same time, relatively simple and compact structural layout and automated continuous wafer-transferring flow having relatively fewer steps in the present disclosure enable parts thereof to achieve self-design, production, and processing conditions so as to reduce production cost. Thereby, a cycle among merely three steps in a relatively simple and compact construction may be realized, then an automatic transfer function for wafer may be realized in a relatively limited space, with efficiency thereof being improved.

In addition, according to forementioned embodiments of the present disclosure, it can be understood that any technical solution formed by any combination of two or more embodiments also falls within the scope of protection of the present disclosure.

It should be understood that, orientation terms in the description of the present disclosure, such as "up", "down", "left", "right", and the like, are used to interpret orientation relationship as illustrated in the attached drawings. These orientation terms should not be interpreted as limitation of the scope of protection of the present disclosure.

The embodiments of the present disclosure are described in a progressive manner. Each embodiment focuses on the differences thereof as compared with other embodiments, and same or similar parts of various embodiments can be referred to each other.

The above are merely preferred embodiments of the invention and are not intended to limit the disclosure. Any modification, equivalent replacement, improvement, and the like made within the spirit and principles of the invention shall be contained in the protection scope of disclosure.

What is claimed is:

1. A load-bearing device, which is telescopic relative to a reference object, comprising:
 a base;
 a movable platform, opposite to the base;
 an ejector rod, which is configured to extend through a bearing secured to the base and is coupled to the movable platform; and
 a driving member, which is fixed relative to the reference object and is configured to push against the ejector rod and in turn to drive the ejector rod to displace relative to the base,
 wherein the load-bearing device further comprises a corrugated tube assembly, which is arranged to surround the ejector rod and comprises a first corrugated tube sleeved on the ejector rod, an upper edge and a lower edge of the first corrugated tube being bonded to a first surface of the movable platform facing towards the base and an upper surface of the base in a sealed manner respectively, the ejector rod and the first corrugated tube cooperating with each other to define collectively a first space which is located below the first surface of the movable platform and communicates to an atmospheric environment through a gap between the ejector rod and the bearing,
 wherein the corrugated tube assembly further comprises an external tube wrapped outside the first corrugated tube, wherein an upper edge and a lower edge of the external tube are bonded to the first surface of the movable platform and the upper surface of the base in a sealed manner respectively, and the base, the movable platform, the first corrugated tube, and the external tube cooperate with one another to define collectively a second space located below the first surface of the movable platform, and
 wherein the movable platform is further provided with a second surface facing away from the base, both the first surface and the second surface being planar and perpendicular to an axis of the ejector rod, with an area of a portion of the first surface delimited between the first corrugated tube and the external tube being smaller than an area of the second surface.

2. The load-bearing device according to claim 1, wherein the second space communicates, through a gas channel formed to penetrate through the base, with a pressure environment at a side of the movable platform facing away from the base.

3. The load-bearing device according to claim 1, wherein the second space communicates, through a gas channel formed to penetrate through the base, with a gas pressure source whose internal gas pressure is adjustable.

4. The load-bearing device according to claim 1, wherein the area of the second surface is not greater than an area of the first surface.

5. The load-bearing device according to claim 1, wherein the external tube is an external corrugated tube sleeved over and surrounding the first corrugated tube.

6. The load-bearing device according to claim 1, wherein the corrugated tube assembly is made of a metallic material selected from a group consisting of the following: nickel, nickel alloy, stainless steel, titanium, titanium alloy, and a combination thereof.

7. The load-bearing device according to claim 1, wherein the driving member comprises a prime motor, which comprises one of following: a linear stepper motor with a trapezoidal lead-screw device, and at least one piezoelectric actuator.

8. The load-bearing device according to claim 7, wherein the driving member further comprises a displacement-amplifying mechanism, which is coupled between the prime motor and the ejector rod and driven by the prime motor, and is configured to output a displacement amount thereof, which is larger than a displacement amount of the prime motor, at an end thereof connecting with the ejector rod, along a first direction in which the ejector rod extends.

9. The load-bearing device according to claim 8, wherein the displacement-amplifying mechanism comprises at least one of following: a linkage mechanism, and a leverage mechanism.

10. The load-bearing device according to claim 9, wherein the linkage mechanism is provided with components symmetrically arranged, whose displacements cancel each other out in opposite directions in a plane orthogonal to the first direction, such that the displacement-amplifying mechanism has a degree of freedom of moving in the first direction at the end being unconstrained and other degrees of freedom thereof at the end being substantially constrained.

11. The load-bearing device according to claim 10,
 wherein the prime motor comprises two piezoelectric actuators arranged in a second direction orthogonal to the first direction, and
 wherein the linkage mechanism comprises:
 a connecting member, coupled to the ejector rod along the first direction;

a crossbar extending in the second direction and connected at a middle portion thereof with the connecting member; and two motion reversing mechanisms which are arranged symmetrically on both sides in a lateral direction of the connecting member and are coupled with the two piezoelectric actuators in transmission relationship therewith in one-to-one correspondence, respectively, each of the motion reversing mechanisms comprising:

a pair of elongated deformable members, symmetrically arranged on both sides of a respective piezoelectric actuator in the first direction and respectively telescopic in the second direction by deforming at respective middle portions, wherein a middle portion of one elongated deformable member in the pair is coupled to the crossbar and a middle portion of the other elongated deformable member in the pair is fixed relative to the reference object; and two connectors, the pair of elongated deformable members being respectively connected at respective proximal ends with respect to the connecting member to one end of the respective piezoelectric actuator via one of the two connectors, and respectively connected at respective distal ends with respect to the connecting member to the other opposite end of the respective piezoelectric actuator via another one of the two connectors.

12. The load-bearing device according to claim 9, wherein the linkage mechanism has components being arranged such that the displacement-amplifying mechanism has a degree of freedom of moving in the first direction at the end being unconstrained and other degrees of freedom thereof at the end being substantially constrained.

13. The load-bearing device according to claim 12, wherein the prime motor comprises the at least one piezoelectric actuator, the linkage mechanism is constructed in a form of a frame and comprises a fixed portion which is fixed with respect to the reference object and a movable portion which is displaceable in the first direction, as well as a coupling portion provided between the fixed portion and the movable portion, with one end of the at least one piezoelectric actuator being hinged in a pivotable manner to the fixed portion of the frame and the other opposite end of the at least one piezoelectric actuator being attached to the movable portion of the frame, the at least one piezoelectric actuator being provided at an angle between 2° and 45° with respect to a second direction orthogonal to the first direction.

14. A wafer transfer device, comprising:

a load-bearing device being arranged to function as a first carrier stage which is liftable vertically by arranging a first direction along which an ejector rod extends in a vertical direction, the load-bearing device being telescopic relative to a reference object and comprising:

a base;

a movable platform, opposite to the base;

the ejector rod, which is configured to extend through a bearing secured to the base and is coupled to the movable platform; and a driving member, which is fixed relative to the reference object and is configured to push against the ejector rod and in turn to drive the ejector rod to displace relative to the base, wherein the load-bearing device further comprises a corrugated tube assembly, which is arranged to surround the ejector rod and comprises a first corrugated tube sleeved on the ejector rod, an upper edge and a lower edge of the first corrugated tube being bonded to a first surface of the movable platform facing towards the base and an upper surface of the base in a sealed manner respectively, the ejector rod and the first corrugated tube cooperating with each other to define collectively a first space which is located below the first surface of the movable platform and communicates to an atmospheric environment through a gap between the ejector rod and the bearing, wherein the corrugated tube assembly further comprises an external tube wrapped outside the first corrugated tube, wherein an upper edge and a lower edge of the external tube are bonded to the first surface of the movable platform and the upper surface of the base in a sealed manner respectively, and the base, the movable platform, the first corrugated tube, and the external tube cooperate with one another to define collectively a second space located below the first surface of the movable platform, and wherein the movable platform is further provided with a second surface facing away from the base, both the first surface and the second surface being planar and perpendicular to an axis of the ejector rod, with an area of a portion of the first surface delimited between the first corrugated tube and the external tube being smaller than an area of the second surface;

a second carrier stage, which is also liftable vertically; and an arm assembly, provided between the first carrier stage and the second carrier stage and comprising:

a rotary shaft which is vertically suspended; and a rotary arm, comprising a rod-shaped body which is rotatably mounted at a lower end of the rotary shaft around a vertical axis of the rotary shaft and extends along a longitudinal axis orthogonal to the vertical axis, wherein the rotary shaft further comprises two supporting portions, which are formed respectively at both ends opposite to each other of the body, and are configured to rotate around the vertical axis so as to perform a wafer transfer action from a top of one of the first carrier stage and the second carrier stage to a top of the other of the first carrier stage and the second carrier stage, by a supporting effect applied by the two supporting portions.

15. The wafer transfer device according to claim 14, wherein each of the supporting portions comprises at least one plate-shaped supporting member perpendicular to the vertical axis, with a minimum distance between respective supporting members of the two supporting portions being larger than a minimum distance between edges of respective top surfaces of the first carrier stage and the second carrier stage, and with a maximum distance between the respective supporting members of the two supporting portions being smaller than a maximum distance between the edges of the respective top surfaces of the first carrier stage and the second carrier stage, and wherein each of the supporting members is arranged to be not in contact with each of the first carrier stage and the second carrier stage when the rotary arm rotates around the vertical axis.

16. The wafer transfer device according to claim 15, wherein, the wafer transfer device is configured such that:

the respective top surfaces of the first carrier stage and the second carrier stage are flush with each other, when the rotary arm is rotated to a first position where the longitudinal axis of the rotary arm is perpendicular to a first plane defined collectively by respective axes of the first carrier stage and the second carrier stage;

the longitudinal axis is coplanar with the first plane, and the first carrier stage and the second carrier stage are lowered such that the respective top surfaces of the first carrier stage and the second carrier stage are located lower than respective upper portions of the two supporting portions, when the rotary arm is rotated to a second position by rotating 90 degrees from the first position; and the longitudinal axis is coplanar with the first plane defined collectively by the respective axes of the first carrier stage and the second carrier stage, and the first carrier stage and the second carrier stage are elevated such that the respective top surfaces of the first carrier stage and the second carrier stage are located higher than the respective upper portions of the two supporting portions, when the rotary arm is rotated to a third position by rotating 180 degrees from the second position.

17. The wafer transfer device according to claim 16, wherein, the two supporting portions are of planar construction, respectively, and are constructed to be two curved plate-shaped supporting members extending to two sides of the body opposite to each other, respectively, in a supporting plane perpendicular to the vertical axis, each of the plate-shaped supporting members being provided with an upper surface perpendicular to the vertical axis.

18. A chamber device configured to exchange a first wafer and a second wafer between different pressure environments, the chamber device comprising:

a first housing, defining an interior vacuum chamber delimited therein as a first pressure environment and defining an outside of the first housing as a second pressure environment, the first housing being further provided with an opening communicating between the first pressure environment and the second pressure environment; and a wafer transfer device, which is provided inside the vacuum chamber and comprises:

a load-bearing device being arranged to function as a first carrier stage which is liftable vertically by arranging a first direction along which an ejector rod extends in a vertical direction, with the first carrier stage being arranged to at least partially overlap with the opening, the load-bearing device being telescopic relative to a reference object and comprising:

a base;

a movable platform, opposite to the base;

the ejector rod, which is configured to extend through a bearing secured to the base and is coupled to the movable platform; and a driving member, which is fixed relative to the reference object and is configured to push against the ejector rod and in turn to drive the ejector rod to displace relative to the base, wherein the load-bearing device further comprises a corrugated tube assembly, which is arranged to surround the ejector rod and comprises a first corrugated tube sleeved on the ejector rod, an upper edge and a lower edge of the first corrugated tube being bonded to a first surface of the movable platform facing towards the base and an upper surface of the base in a sealed manner respectively, the ejector rod and the first corrugated tube cooperating with each other to define collectively a first space which is located below the first surface of the movable platform and communicates to an atmospheric environment through a gap between the ejector rod and the bearing, wherein the corrugated tube assembly further comprises an external tube wrapped outside the first corrugated tube, wherein an upper edge and a lower edge of the external tube are bonded to the first surface of the movable platform and the upper surface of the base in a sealed manner respectively, and the base, the movable platform, the first corrugated tube, and the external tube cooperate with one another to define collectively a second space located below the first surface of the movable platform, and wherein the movable platform is further provided with a second surface facing away from the base, both the first surface and the second surface being planar and perpendicular to an axis of the ejector rod, with an area of a portion of the first surface delimited between the first corrugated tube and the external tube being smaller than an area of the second surface;

a second carrier stage, which is also liftable vertically; and an arm assembly, provided between the first carrier stage and the second carrier stage and comprising:

a rotary shaft which is vertically suspended; and a rotary arm, comprising a rod-shaped body which is rotatably mounted at a lower end of the rotary shaft around a vertical axis of the rotary shaft and extends along a longitudinal axis orthogonal to the vertical axis, wherein the rotary shaft further comprises two supporting portions, which are formed respectively at both ends opposite to each other of the body, and are configured to rotate around the vertical axis so as to perform a wafer transfer action from a top of one of the first carrier stage and the second carrier stage to a top of the other of the first carrier stage and the second carrier stage, by a supporting effect applied by the two supporting portions;

wherein the transfer device further comprises a valve plate, which is co-axially provided on the first carrier stage and is configured to be elevated or lowered with the first carrier stage so as to close or open the opening.

19. A wafer processing apparatus, comprising:

a first housing, defining an interior vacuum chamber, in which a wafer processing device or a wafer detection device is installed;

a wafer transfer device, comprising:

a load-bearing device being arranged to function as a first carrier stage which is liftable vertically by arranging a first direction along which an ejector rod extends in a vertical direction, the load-bearing device being telescopic relative to a reference object and comprising:

a base;

a movable platform, opposite to the base;

the ejector rod, which is configured to extend through a bearing secured to the base and is coupled to the movable platform; and a driving member, which is fixed relative to the reference object and is configured to push against the ejector rod and in turn to drive the ejector rod to displace relative to the base, wherein the load-bearing device further comprises a corrugated tube assembly, which is arranged to surround the ejector rod and comprises a first corrugated tube sleeved on the ejector rod, an upper edge and a lower edge of the first corrugated tube being bonded to a first surface of the movable platform facing towards the base and an upper surface of the base in a sealed manner respectively, the ejector rod and the first corrugated tube cooperating with each other to define collectively a first space which is located below the first surface of the movable platform and communicates to an atmospheric environment through a gap between the ejector rod and the bearing, wherein the corrugated tube assembly further comprises an external tube wrapped outside the first corrugated tube, wherein an upper edge and a lower edge of the external tube are bonded to the first surface of the movable platform and the upper surface of the base in a sealed manner respectively, and the base, the movable platform, the first corrugated tube, and the external tube cooperate with one another to define collectively a second space located below the first surface of the movable platform, and wherein the movable platform is further provided with a second surface facing away from the base, both the first surface and the second surface being planar and perpendicular to an axis of the ejector rod, with an area of a portion of the first surface delimited between the first corrugated tube and the external tube being smaller than an area of the second surface;

a second carrier stage, which is also liftable vertically; and an arm assembly, provided between the first carrier stage and the second carrier stage and comprising:

a rotary shaft which is vertically suspended; and a rotary arm, comprising a rod-shaped body which is rotatably mounted at a lower end of the rotary shaft around a vertical axis of the rotary shaft and extends along a longitudinal axis orthogonal to the vertical axis, wherein the rotary shaft further comprises two supporting portions, which are formed respectively at both ends opposite to each other of the body, and are configured to rotate around the vertical axis so as to perform a wafer transfer action from a top of one of the first carrier stage and the second carrier stage to a top of the other of the first carrier stage and the second carrier stage, by a supporting effect applied by the two supporting portions; and a second housing, which is adjacent to the first housing and defines a transition chamber, wherein, the first housing is formed with an opening communicating to the second housing, and the first carrier stage of the wafer transfer device is arranged to at least partially overlap with the opening;

the wafer transfer device further comprises a valve plate, which is co-axially provided on the first carrier stage and is configured to be elevated or lowered with the first carrier stage so as to close or open the opening; and the transition chamber communicates with the vacuum chamber via the opening at one side thereof, and also communicates with the atmospheric environment via a second valve at the other side thereof.

* * * * *